US009379666B2

(12) United States Patent
Kitayoshi et al.

(10) Patent No.: US 9,379,666 B2
(45) Date of Patent: Jun. 28, 2016

(54) MICROWAVE BAND BOOSTER RECTIFIER CIRCUIT, AND WIRELESS TAG DEVICE AND WIRELESS TAG SYSTEM EMPLOYING SAME

(75) Inventors: Hitoshi Kitayoshi, Miyagi (JP); Kunio Sawaya, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 178 days.

(21) Appl. No.: 13/976,578

(22) PCT Filed: Dec. 21, 2011

(86) PCT No.: PCT/JP2011/079728
§ 371 (c)(1),
(2), (4) Date: Jul. 24, 2013

(87) PCT Pub. No.: WO2012/090840
PCT Pub. Date: Jul. 5, 2012

(65) Prior Publication Data
US 2013/0314216 A1 Nov. 28, 2013

(30) Foreign Application Priority Data

Dec. 28, 2010 (JP) ................................. 2010-293145

(51) Int. Cl.
*H04Q 5/22* (2006.01)
*H02M 7/06* (2006.01)
(Continued)

(52) U.S. Cl.
CPC .............. *H03D 1/04* (2013.01); *G06K 7/10009* (2013.01); *G06K 19/0723* (2013.01); *H04L 27/02* (2013.01); *H04L 27/18* (2013.01); *H04B 1/7163* (2013.01)

(58) Field of Classification Search
CPC .......... G06K 19/0723; G06K 7/10009; G06K 19/07749; H04B 1/7163; H04B 5/0062; H04L 27/02; H04Q 2213/13095; H01Q 13/18; H01Q 1/085; H01Q 13/08; H01Q 1/2225
USPC ................ 340/10.1, 10.2, 10.31, 10.34, 10.4, 340/10.42, 10.5, 572.7, 10.51; 235/375, 235/377, 379, 385, 382.5; 343/745, 803
See application file for complete search history.

(56) References Cited

U.S. PATENT DOCUMENTS 6,140,924 A * 10/2000 Chia .................. G08B 13/2431
323/220
2004/0145452 A1* 7/2004 Fischer .............. G06K 7/10861
340/10.1

(Continued)

FOREIGN PATENT DOCUMENTS

JP 07-221681 8/1995
JP 2004-140438 5/2004
(Continued)

OTHER PUBLICATIONS

Ministry of Internal Affairs and Communications, "For Realization of Ubiquitous Sensor Network (Final Report)", http://www.soumu.go.jp/s-news/2004/040806-4-b2.html/,Jul. 2004 (English translation not available).

(Continued)

*Primary Examiner* — Mirza Alam
(74) *Attorney, Agent, or Firm* — Young & Thompson

(57) ABSTRACT

In order to implement novel utilization methods, implementation of a low power consumption and high sensitivity RF receiving system is desired. A microwave frequency band stub resonance booster circuit characterized by boosting the amplitude of an RF signal in a passive operation by resonating in series a 0.2 pF to 0.01 pF micro-capacitor element with a λg/2 open stub element to perform impedance conversion of the input RF signal is used. In addition, since a capacitor which has been conventionally inserted in order to repeat charging and discharging of the RF signal by using two diodes becomes useless by putting a DC resonant component of resonant-boosted output into an open state when voltage-doubling and rectifying the resonant-boosted RF signal, rectified output can be obtained and high-sensitivity reception and detection of the RF signal becomes possible without being affected by the capacitor which imparts comparatively large insertion loss.

11 Claims, 16 Drawing Sheets

(51) Int. Cl.
*H03D 1/00* (2006.01)
*H03D 1/04* (2006.01)
*H04L 27/02* (2006.01)
*H04L 27/18* (2006.01)
*G06K 7/10* (2006.01)
*G06K 19/07* (2006.01)
*H04B 1/7163* (2011.01)

(56) References Cited

U.S. PATENT DOCUMENTS

| | | | | |
|---|---|---|---|---|
| 2005/0104790 | A1* | 5/2005 | Duron | G06K 19/0723 343/745 |
| 2006/0170515 | A1* | 8/2006 | Yoshida | H01P 5/02 333/33 |
| 2007/0057771 | A1* | 3/2007 | Tomioka | G01K 1/022 340/10.1 |
| 2009/0033462 | A1 | 2/2009 | Kitayoshi et al. | |
| 2009/0121837 | A1 | 5/2009 | Kitayoshi et al. | |
| 2009/0134979 | A1 | 5/2009 | Tsukamoto et al. | |
| 2010/0188306 | A1 | 7/2010 | Kitayoshi et al. | |
| 2010/0245052 | A1 | 9/2010 | Kitayoshi | |

FOREIGN PATENT DOCUMENTS

| | | |
|---|---|---|
| JP | 2005-278139 | 10/2005 |
| JP | 2005-311968 | 11/2005 |
| JP | 2008-066808 | 3/2008 |
| JP | 2008-219624 | 9/2008 |
| JP | 2009-094739 | 4/2009 |
| JP | 2009-130896 | 6/2009 |
| JP | 2010-288133 | 12/2010 |
| WO | 2007010869 | 1/2007 |
| WO | 2007148401 | 12/2007 |

OTHER PUBLICATIONS

Hitoshi Kitayoshi and Kunio Sawaya, "Advanced Low Power Long Distance RF-Tag Systems by Using Modulated Subcarrier Wave" IEICE Technical Report, SIS2007-47, pp. 13-18, Dec. 2007.

Hitoshi Kitayoshi, "High Resolution Technique for Short Time Frequency Spectrum Analysis", IEIEC Trans A, vol. J76-A, No. 1, pp. 78-81, Jan. 1993 (with English Abstract).

International Search Report PCT/JP2011/079728 dated Mar. 27, 2012, with English translation.

* cited by examiner (a) EXAMPLE 1 OF MICROWAVE BAND BOOSTER RECTIFIER CIRCUIT OF THE PRESENT INVENTION (b) EXAMPLE 2 OF MICROWAVE BAND BOOSTER RECTIFIER CIRCUIT OF THE PRESENT INVENTION (c) EXAMPLE 3 OF MICROWAVE BAND BOOSTER RECTIFIER CIRCUIT OF THE PRESENT INVENTION AND PASSIVE TYPE ASK DEMONSTRATION CIRCUIT

(a) WIRELESS TAG CONTROL AND RESPONSE SIGNAL GENERATION UNIT (b) RECEIVED SIGNAL BOOST RECTIFICATION DETECTION AND ASK DEMODULATION UNIT (c) PULSE CODING KEY DETECTION UNIT (a) RADER-TO-TAG RANGE 7m  (b) READER-TO-TAG RANGE 20m (a) READER-TO-TAG RANGE 7m  (b) READER-TO-TAG RANGE 20m (a) READER-TO-TAG RANGE 7m  (b) READER-TO-TAG RANGE 20m

FIG. 23

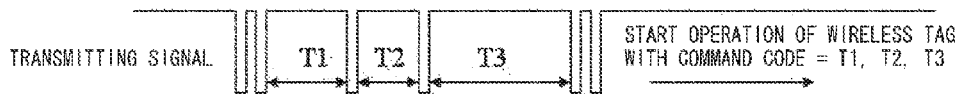

TRANSMITTING SIGNAL | T1 | T2 | T3 | START OPERATION OF WIRELESS TAG WITH COMMAND CODE = T1, T2, T3

FIG. 24

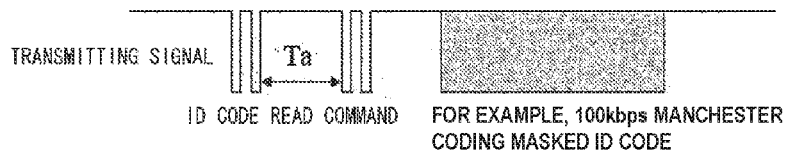

TRANSMITTING SIGNAL | Ta |
ID CODE READ COMMAND    FOR EXAMPLE, 100kbps MANCHESTER CODING MASKED ID CODE

FIG. 25

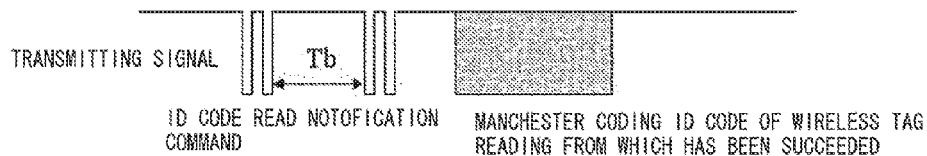

TRANSMITTING SIGNAL | Tb |
ID CODE READ NOTOFICATION COMMAND    MANCHESTER CODING ID CODE OF WIRELESS TAG READING FROM WHICH HAS BEEN SUCCEEDED

FIG. 26

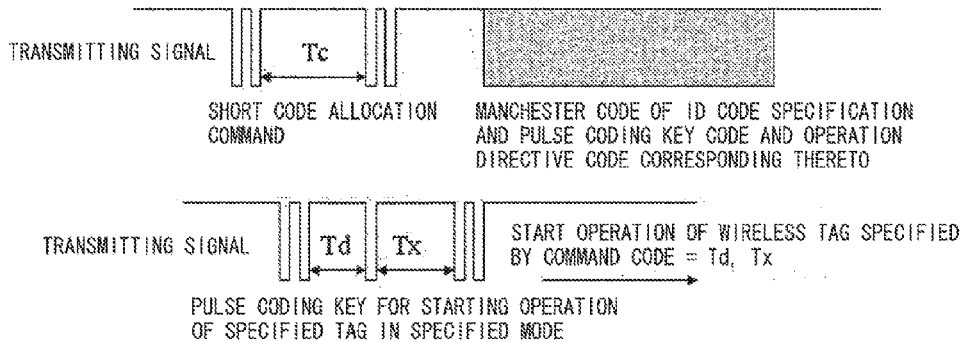

TRANSMITTING SIGNAL | Tc |
SHORT CODE ALLOCATION COMMAND    MANCHESTER CODE OF ID CODE SPECIFICATION AND PULSE CODING KEY CODE AND OPERATION DIRECTIVE CODE CORRESPONDING THERETO

TRANSMITTING SIGNAL | Td | Tx |   START OPERATION OF WIRELESS TAG SPECIFIED BY COMMAND CODE = Td, Tx

PULSE CODING KEY FOR STARTING OPERATION OF SPECIFIED TAG IN SPECIFIED MODE

MICROWAVE BAND BOOSTER RECTIFIER CIRCUIT, AND WIRELESS TAG DEVICE AND WIRELESS TAG SYSTEM EMPLOYING SAME

TECHNICAL FIELD

The present invention relates to a microwave frequency band stub resonance booster circuit and a wireless tag device and a wireless tag system employing same.

BACKGROUND ART

Research and development of a component technology for implementing various ubiquitous sensor networks are being actively carried out. As subjects for widely spreading this technology, downsizing of sensor terminals for not making aware of locations and possession thereof, yearly power consumption reduction, life-lengthening and real time response performance of the battery life are sought for (Non Patent Document 1).

In communication technologies such as ZigBee, Bluetooth (registered trademark), UWB and the like research and development of which are being promoted by conventional sensor network terminals, the power consumption reduction by a sleep periodic startup operation sacrificing the real time response performance is promoted with competition for the battery life. Although application of such sensors to a system that sufficient effect can be expected if communication is established at a rate of one time in every five minutes as in sensing or the like of climatic environment is effective, realization of real time bidirectionality becomes an important subject in systems for sensing/guiding risk information and supporting/watching aged persons and others which are listed in the future vision (Non Patent Document 1) of the ubiquitous sensor networks.

The inventors and others have promoted development of small-sized and low power consumption wireless connection sensor terminals and sensor network systems using the ever proposed wearable antenna (Patent Document 1), and the low power consumption and real time bidirectional wireless connection technology (Patent Document 2) for the purpose of contributing to construction of the ICT reliable and safe social infrastructure. In addition, they experimentally manufacture and evaluate sensor tags which operate under the ARIB STD-T81 standard and a reading operation up to 35 m of which has been confirmed with 2.45 GHz band 3 mW/MHz reader output. These tags are three kinds of sensor wireless tags for 20-time per second continuous ranging, tri-axial acceleration sensor wireless tags for operating in 350-time per second continuous sampling and electrocardiograph sensor wireless tags, and any of them is about 3 mm in thickness, is soft and can be integrated with a dress. In addition, the consumption current of a built-in 3V coin-cell battery in continuous operation was 10 µA, 633 µA and 583 µA in the respective tags (Non Patent Document 2).

In the present specification, there will be disclosed a small-sized, low power consumption and long-life real time wireless data communication terminal which allows positioning in the 5 GHz band for a wireless distributed sensor network targeting on a moving body such as ITS or the like which is being developed aiming at power consumptions of not more than 500 µW in continuous transmission and reception of 100 kbps data and of not more than 10 µW in standby, and a communicable range of at least 30 m with an positioning error of not more than 10 cm.

First, the basic study to attain range lengthening and power consumption reduction of a 5 GHz band sensor tag will be described and then a flexible cavity-backed slot antenna, a stub resonance booster receiving circuit, and a pulse coding key detection and subcarrier MPSK modulation system for a waking-up operation which is reduced in power consumption and malfunction will be disclosed as techniques for range lengthening and power consumption reduction.

In addition, a DSP receiver for reader which has been experimentally manufactured for high speed/high precision positioning, and performs inverse Fourier transformation and interpolation ranging process of frequency response of a reflected subcarrier signal in the 200 MHz band width within 5 ms will be also disclosed.

FIG. 1 is an example of a conventional passive wireless tag device and a circuit diagram described in FIG. 2 of Patent Document 3.

In this figure a capacitor C1 connected to an antenna element L2 resonates with a $\lambda g/4$ short stub L3 to boost the amplitude of an antenna received RF signal by about 10 times. D3 rectifies and detects it to charge C3, and the RF signal which has been boosted by the stub voltage-doubles and rectifies by being connected to D4 and D5 via C2. Since a reference potential of the above-mentioned voltage doubler rectifier circuit works as a charge voltage of C3, a tripled rectified voltage of the above-mentioned stub boosted RF signal is charged to C4.

In this circuit, a 30-time multiplied rectified voltage of the received RF signal which has been charged to C4 is used for driving a microprocessor U7 or the like, and a 10-time multiplied rectified voltage of the received RF signal which has been charged to C3 is used for ASK demodulation of the received signal. Here, it is described that the reason for proper use of two kinds of rectified voltages of the stub boosted RF signal lies in that a comparatively high drive voltage is needed for the above-mentioned U7 and the like, and a short time constant (a comparatively low output impedance) is required for ASK demodulation of the above-mentioned received signal.

However, all the embodiments described in Patent Document 3 including FIG. 1 are for the 2.45 GHz band (the UHF band), and it was found that a boosted rectified output voltage required for the wireless tag cannot be obtained in the microwave band (3-30 GHz). For example, the voltage to be charged to C3 in FIG. 1 in the 5 GHz band was only up to about 3 times the received RF signal voltage, and the voltage to be charged to C4 was only up to about 6 times the received RF signal voltage.

It is thought that the cause for large drop of the boost ratio lies in (1) the Q value of the short stub itself has been lowered and (2) the junction capacitance of D3 and the junction capacitances of D4 and D5 which are connected via C2 have worked as loads on the stub resonance booster circuit (the resonance circuit by C1 and L3) and have further lowered the Q value of the resonance circuit. Here, it is thought that (1) is caused by an increase in electromagnetic wave radiation loss from the stub short end with frequency rising and the cause of (2) lies in that a +j impedance component in stub resonance could not thoroughly compensate for a −j impedance component of the capacitance load due to (1).

FIG. 2 is a microwave band booster rectifier circuit of the present invention which is mainly used in a passive type wireless tag device. (a) and (b) of FIG. 2 are examples that a voltage-doubler rectifier circuit is combined with a $\lambda g/2$ open stub resonant booster circuit, and (c) is an example that a voltage-quadrupler rectifier circuit and an ASK demodulation circuit are combined with the λg/2 open stub resonant booster circuit.

In case of the 5 GHz band in FIG. 2, C1=0.1 pF, C2-C4=1 pF, C5=L1-L3=5 nH, R1=10 kΩ, R2=2.2 MΩ, RL is an equivalent load resistance of the wireless tag circuit, D1 to D4 are DMF2828 (a Schottky barrier diode of Cj=0.1 pF), D5 is a backflow prevention diode, D6 is a Zener diode for protection, and U1 is a Schmitt trigger inverter. In a result of experiments on these circuits, with a resonance frequency set in the 5 GHz band, a −20 dBm sine wave input into RFin at 50Ω and RL=10 MΩ, $V_0$=470 mV (21 times in boost ratio) in the case of (a), $V_0$=420 mV (19 times in boost ratio) in the case of (b) and $V_0$=720 mV (33 times in boost ratio) in the case of (c) were obtained. It can be said that the output voltage of (c) is a voltage sufficient to operate the wireless tag circuit. In addition, also in the configurations of (a) and (b), if about −15 dBm is present as the input power, it will be possible to operate the wireless tag circuit.

In the following, differences between FIG. 1 of the conventional system and FIG. 2 according to an embodiment of the present invention will be described.

A) In FIG. 1, the short stub is used for resonant boosting of the RF signal, and in FIG. 2, the open stub is used for it.

B) The reason for use of the short stub in FIG. 1 in A) lies in that since the stub length can be shortened in the UHF band and simple rectification by D3 is possible, ASK demodulation which is low in output impedance (fast in response) was possible.

C) The reason for using the open stub not using the short stub in FIG. 2 of A) lies in that the stub length is not too much shortened in the microwave band and the electromagnetic wave radiation loss is suppressed to make it possible to maintain the Q value, and since the stub is in a DC and open state, insertion of a capacitor (C2 in case of FIG. 1) required for voltage-doubling rectification became unnecessary and as a result of which the loss due to the inserted capacitor in the microwave band could be eliminated.

D) in FIG. 2, the inductors L1 to L3 are inserted into the RF boosted signal rectifying diode which is not used in FIG. 1.

E) in FIG. 1 in D), the Q value of the stub in the UHF band is sufficiently high and the +j impedance component in stub resonation could compensate for the −j impedance component of the capacitance load.

G) in FIG. 2 in D), the Q value of the stub is not sufficiently high in the microwave band and the +j impedance component in stub resonation cannot thoroughly compensate for the −j impedance component of the capacitance load. Thus, a position where the inductor is to be inserted is set such that the junction capacitance of the rectifier diode is made to resonate with the inserted inductors so as to reduce the capacitance load and to generate a high RF voltage in the rectifier diode element (a position where the rectifier diode element most approaches the stub or a position where it most approaches GND of the RF potential is preferable).

In FIG. 2, a difference between (a) and (b) is that in case of (a), the rectifier diode element most approaches the stub, and in case of (b), the rectifier diode element most approaches GND of the RF potential. In addition, while in case of (b), a common L1 is inserted into D1 and D2, in case of (a), L1 is inserted into D1 and L2 is inserted into D2. In this case, since the connection conditions of D1 and D2 are different from each other, a higher boost ratio can be obtained by the inductor insertion method of (a).

In (c) of FIG. 2, the stub resonance boosted RF signal is voltage-doubled rectified in D1 and D2 to charge C2 and a doubled rectified voltage of the stub resonance boosted RP signal is added by using D3 and D4 with the direct current potential of C2 used as a reference to charge C4, thereby obtaining a quadrupled rectified voltage. At that time, C3 is inserted for the purpose of separating the DC potential of the stub from the DC potential of the common terminal of D3 and D4.

The ASK demodulation method by U1 in FIG. 1 is the same as the ASK demodulation method by U1 in FIG. 2, and after the received signal has been stub resonance boosted rectified detected, determination as to 0 and 1 which are received data codes is performed by a comparator operation using ½ of the amplitude peak potential as a threshold value.

FIG. 3 is an example of a conventional semi-passive wireless tag device and a circuit diagram described in FIG. 4 of Patent Document 2.

In this figure, the capacitor C1 connected to an antenna element 22 resonates with a λg/4 short stub 23 and boosts the amplitude of the antenna received RF signal by about 10 times. It is made such that while the boosted RF signal is connected to an anode of D3 via C2 and is detected, a DC bias current flows into the anode of D3 via R3. This DC bias current aims to generate an input offset voltage in order to improve the detection sensitivity of D3 to a weak RF received signal and to generate an input offset voltage in order to operate a comparator U1 by a single power source. In addition, it is made such that DC bias current which is slightly smaller than that into the D3 flows into D4 to which the RF signal is not applied via R4. Therefore, in this circuit, in the absence of the RF input signal, VD3>Vd4, and in the presence of the RF input signal, VD<D4 so as to obtain ASK demodulated data from the comparator U1. However, all the embodiments described in Patent Document 2 including FIG. 3 involve the 2.45 GHz band and it was found that the receiving sensitivity required in the wireless tag cannot be obtained in the microwave band.

For example, while a minimum receiving ASK demodulation sensitivity of the circuit in FIG. 3 in the 2.45 GHz band was −45 dBm, it was about −30 dBm in the 5-GHz band. It is thought that the cause for great degradation of the receiving sensitivity of the circuit in FIG. 3 in the microwave band as described above lies in that as in the case of the circuit in FIG. 1, (1) the Q value of the short stub itself has been reduced, (2) the junction capacitance of D3 which is connected via C2 has worked as the load on the stub resonant circuit and has further reduced the Q value of the resonant circuit, and (3) C2 which has been inserted in order to separate the stub which is at the DC and GND potential from the biased potential of D3 has caused not negligible loss to generate in the microwave hand.

FIG. 4 is an ASK demodulation circuit using the microwave band booster rectifier circuit of the present invention, which is mainly used in a semi-passive type wireless tag device. Values and type names of respective elements used in this figure are ones all used in the experiment in the 5 GHz band and an ASK demodulation minimum input sensitivity was 50Ω, −48 dBm with input into RFin. In addition, in the figure, RFin is an input terminal of the received RF signal from the wireless tag antenna, RxData is an ASK demodulation output terminal of that signal, RxEnable is a control input for bringing U1 to U3 into active states in reception standby.

In the circuit in FIG. 4, C1 connected to RFin resonates with the λg/2 open stub to boost the amplitude of the input RF signal by about 10 times and this is voltage-doubled rectified by D1 and D2 to charge C2. On the other hand, a DC bias voltage is obtained at C3 by voltage division of R1 and R2 and it supplies forward bias currents to D1 to D4. Here, the reason why the D1 and D2 are forward biased lies in that a DC offset voltage is needed for the input signal for the purpose of preventing degradation of detection sensitivity to the weak RF signal and in order to operate U2 by a single power source.

Although the bias currents which flow into D1 and D3 and into D3 and D4 when no input signal is present in RFin are respectively determined by R3 and R6+R7, they are made such that the former becomes slightly larger due to a difference in resistance value and the voltage to be charged into C4 becomes slightly higher than the voltage to be charged into C2. In addition, the respectively charged voltages are connected to an operational amplifier U2 via R4 and to an operational amplifier U3 via R5. Feedback resistances of the operational amplifiers U2 and U3 use R11 in common, and the U2 side uses R9 and D6 and the U3 side uses R10 to control gains.

The reason for use of D6 in a feedback circuit of U2 lies in that AGC control is performed so as not to bring U2 into a saturated state even in a case where a comparatively large signal has been input into RFin. In addition, C4 is charged with output from U2 via R8 and D5 so as to raise the input voltage on the U3 side because there exist such effects that the influence of noise is suppressed and the ASK demodulation response performance to detection response of first-order lag is increased by making it follow a threshold value (an output of U3) of the ASK demodulation comparator U1 to which an output of U2 is connected in accordance with the average amplitude of the input signal into RFin.

In the following, differences between FIG. 3 of the conventional system and FIG. 4 of the present invention will be described.

A) in FIG. 3, the short stub is used for resonant boosting of the RF signal, and in FIG. 4, the open stub is used.

B) The reason for use of the short stub in FIG. 3 of A) lay in that the stub length can be shortened in the UHF band.

C) The reason for use of the open stub in FIG. 4 in the A) not using the short stub lies in that the stub length is not shortened too much in the microwave band, the electromagnetic wave radiation loss is suppressed and therefore the Q value can be maintained, and since the stub is in the DC and open state, insertion of the capacitor (C2 in the case in FIG. 3) needed for bias application is not needed, and as a result of which the loss due to the inserted capacitor in the microwave band could be eliminated.

D) in FIG. 4, the inductors L1 and L2 are inserted into the RF boosted signal rectification diode which is not used in FIG. 3.

E) in FIG. 3 in the D), the Q value of the stub is sufficiently high in the UHF band and the +j impedance component in stub resonance could compensate for the −j impedance component of the capacitance load.

F) in FIG. 4 in the D), the Q value of the stub is not sufficiently high in the microwave band, and the +j impedance component in stub resonance cannot thoroughly compensate for the −j impedance component of the capacitance load. Therefore, the junction capacitance of the rectifier diode and the inserted inductor are made to resonate with each other to reduce the capacitance load and the insertion position of the inductor is set so as to generate a high RF voltage in the rectifier diode element (the position where the rectifier diode element most approaches the stub or the position where it most approaches GND of the RF potential is preferable).

G) in FIG. 3, since a simple system of detecting the RF signal by D3 is used, the output impedance of a detection output is comparatively low and the time constant of first-order lag is small, comparatively high-speed demodulation of the ASK signal was possible even in the absence of a follower circuit for the comparator threshold value to the RF input signal amplitude average value.

H) In FIG. 4, although there was the effect of improving the detection sensitivity by utilizing voltage-doubling rectification detection by D1 and D2, the output impedance of the detection output was increased and the time constant of first-order lag was increased. Therefore, addition of the follower circuit for the comparator threshold value to the RF input signal amplitude average value is needed in case of performing demodulation of a comparatively high-speed ASK signal.

PRIOR ART DOCUMENTS

Patent Document

Patent Document 1: Japanese Patent Application Laid-Open No. 2008-66808
Patent Document 2: Japanese Patent Application Laid-Open No. 2008-219624
Patent Document 3: WO2007/010869

Non Patent Document

Non Patent Document 1: Ministry of Internal Affairs and Communications, "For Realization of Ubiquitous Sensor Network (Final Report)", http://www.soumu.go.ip/s-news/2004/040806_4_b2.html/, July, 2004.
Non Patent Document 2: Kitayoshi, Sawaya, "Advanced Low Power Long Distance RF-Tag Systems by Using Modulated Subcarrier Wave", IEICE Technical Report, SIS2007-47, pp. 13-18, December 2007.
Non Patent Document 3: Kitayoshi, "High Resolution Technique for Short Time Frequency Spectrum Analysis", IEIEC Trans A, vol. J76-A, no. 1, pp. 78-81, January 1993.

DISCLOSURE OF THE INVENTION

Problems to be Solved by the Invention

UHF-band radio wave systems, 800-900 MHz band and 2.45 GHz band wireless tags allowing reading from a distance of about 10 m are put into practical use. An object of the present invention is to implement a novel utilization method of a radio wave type wireless tag in a microwave frequency band which can be utilized in the 5 Ghz band and 24 GHz band of ISM from the viewpoint of efficient utilization of radio wave resources. Specifically, it is to propose a microwave band booster rectifier circuit to provide a technology which allows lengthening of a read range of up to about 100 m by improving the receiving sensitivity of the wireless tag, and remote sensing of the position of the wireless tag with an error of about 10 cm by utilizing broadband performance exceeding 100 MHz which is a feature of the 5 GHz band and the 24 GHz band.

Means to Solve the Problems

A first embodiment is a microwave frequency band stub resonance booster circuit characterized in that the amplitude of an RF signal is boosted by making a 0.2 pF to 0.01 pF micro-capacitor element and a λg/2 open stub element resonate in series to carry out impedance conversion of the input RF signal.

In another embodiment, an anode or cathode terminal of a rectifier diode element 1 and a terminal of a rectifier diode element 2 which is opposite to that of the rectifier diode element 1 in polarity are connected to a connection point between the above-mentioned micro-capacitor element and open stub element, the other terminal of the rectifier diode element 1 is connected to an RF signal ground level part, the other terminal of the rectifier diode element 2 is connected to a capacitance element for rectified output to charge it to obtain boosted rectified output of the RF input signal.

In a further embodiment, output of another rectifier circuit which has been separated with direct current is used as the RF signal ground level part.

Also disclosed is the microwave band booster rectifier circuit, wherein a 1 nH to 10 nH inductance element which resonates in series with the junction capacitance of the rectifier diode is inserted into one side of the rectifier diode element for the purposes of reducing that a rectifier diode junction capacitance of the above-mentioned rectifier diode element works as a capacitive load on boosted output of the above-mentioned RF signal amplitude, and of inducing a higher RF signal amplitude by the rectifier diode element.

In a further embodiment, a direct current bias source is used as the above-mentioned RF signal ground level part to flow forward bias current into said rectifier diode, thereby obtaining detected output even for a weak RF input signal.

Further, in an ASK demodulation method of supplying bias current also to a diode group which has been separated from an RF signal by a microwave band booster rectifier circuit having the direct current bias source to determine presence/absence of the RF signal in accordance with a difference in output potential, a wireless tag device characterized by promoting acceleration of ASK demodulation by adding an output average voltage on the side of the microwave band booster rectifier circuit to an output of the diode group separated from the RF signal.

In an additional embodiment, one or more kinds of pulse width detection circuit(s) is/are connected to said ASK demodulation output to make a control circuit (a microprocessor) which operates as a standby timer execute interruption processing with output from the pulse width detection circuit, thereby performing standby for pulse string code reception of a received RF signal by a combination of an inter-pulse time measurement result by the timer with the pulse type with low power consumption.

Also disclosed is a wireless tag system characterized in that a wireless tag specified by the standby for pulse string code reception is activated and a CW subcarrier response signal using a built-in oscillation source which is high in frequency stability is returned to a reader side for a fixed time, whereby the reader side sweeps a query frequency within the fixed time to observe a tag-to-reader reciprocal frequency response, thereby obtaining the position of the tag.

Also, there is disclosed a wireless tag system according, wherein a wireless tag which has been specified by said standby for pulse string code reception is activated, and a result of measurement by a sensor is digitized for a fixed time and is transferred to a reader side by subcarrier MPSK.

Effect of the Invention

According to the present invention, it becomes possible to implement a novel utilization method of the radio wave type wireless tag in the microwave frequency band which can be utilized in the 5 GMz band and the 24 GHz band of ISM from the viewpoint of efficient utilization of the radio wave resources.

BRIEF DESCRIPTION OF THE DRAWINGS

FIG. 3 is a circuit diagram of a conventional semi-passive wireless tag device.

FIG. 4 is a microwave band booster rectifier type ASK demodulation circuit according to an embodiment of the present invention mainly used in a semi-passive wireless tag device.

FIG. 23 is a diagram for explaining the rule of a protocol of communication with a reader in this wireless tag device.

FIG. 24 is a diagram for explaining the rule of a protocol of communication with a reader in this wireless tag device.

FIG. 25 is a diagram for explaining the rule of a protocol of communication with a reader in this wireless tag device.

FIG. 26 is a diagram for explaining the rule of a protocol of communication with a reader in this wireless tag device.

EMBODIMENTS

Figure 5:
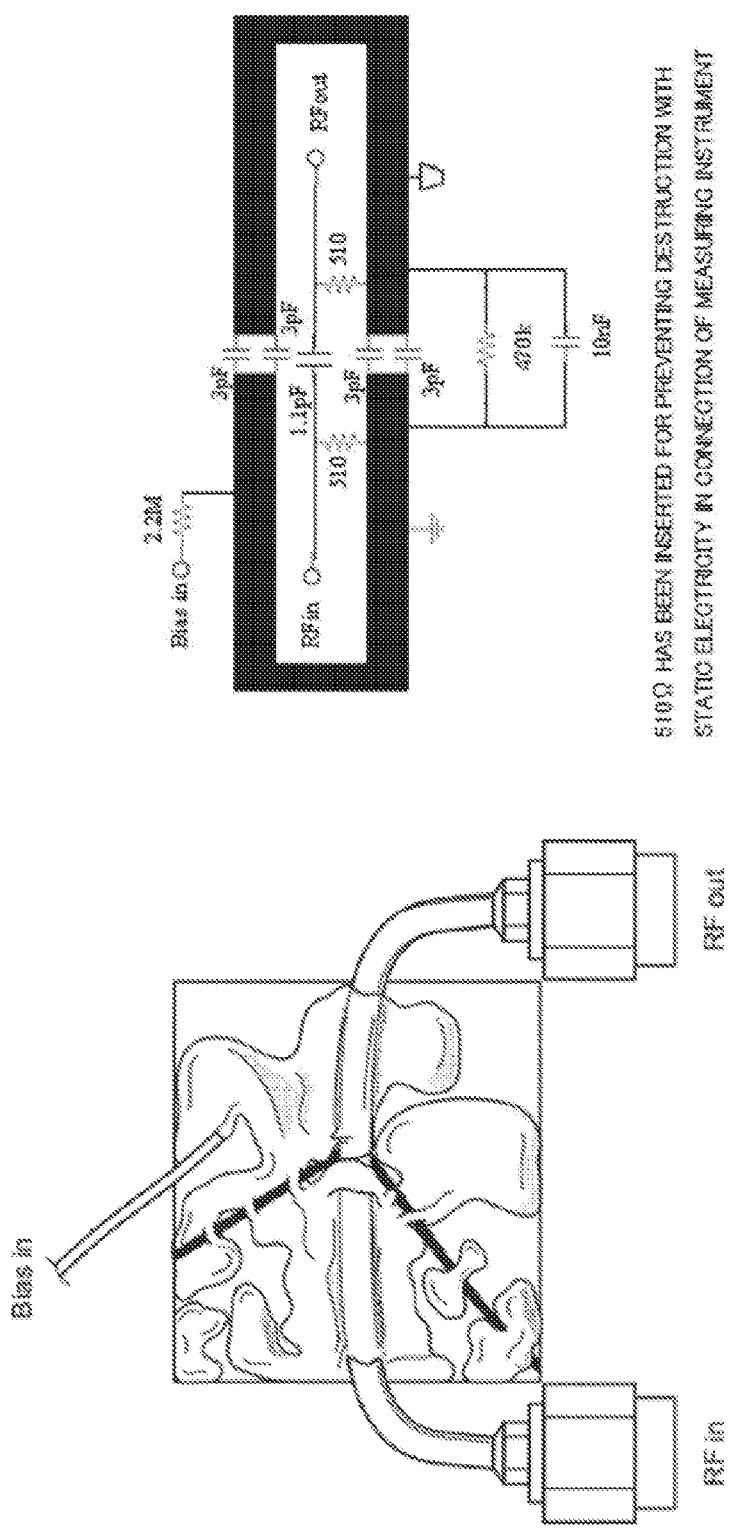
FIG. 5 illustrates a photograph and a circuit diagram showing an example of a bias application adopter for test evaluation used in a semi-passive wireless tag.

FIG. 5 is an example of an adopter for applying a bias voltage to a received signal detection rectification diode used in a semi-passive type wireless tag, showing a photograph and a circuit diagram of a board used for experiment evaluation. In this circuit, the bias voltages to be applied to the diode are produced by dividing a Bias in terminal voltage by 2.2 MΩ and 470 kΩ. An open DC bias voltage when 3V has been applied to the Bias in is about 528 mV and a DC output impedance is about 387 kΩ. In addition, characteristic impedances of both of RFin and RFout are set at about 50Ω in the microwave frequency band. Incidentally, in this embodiment, a measure for preventing electrostatic destruction in connection to a measuring instrument is taken and therefore a resistance of 510Ω is used.

Figure 1:
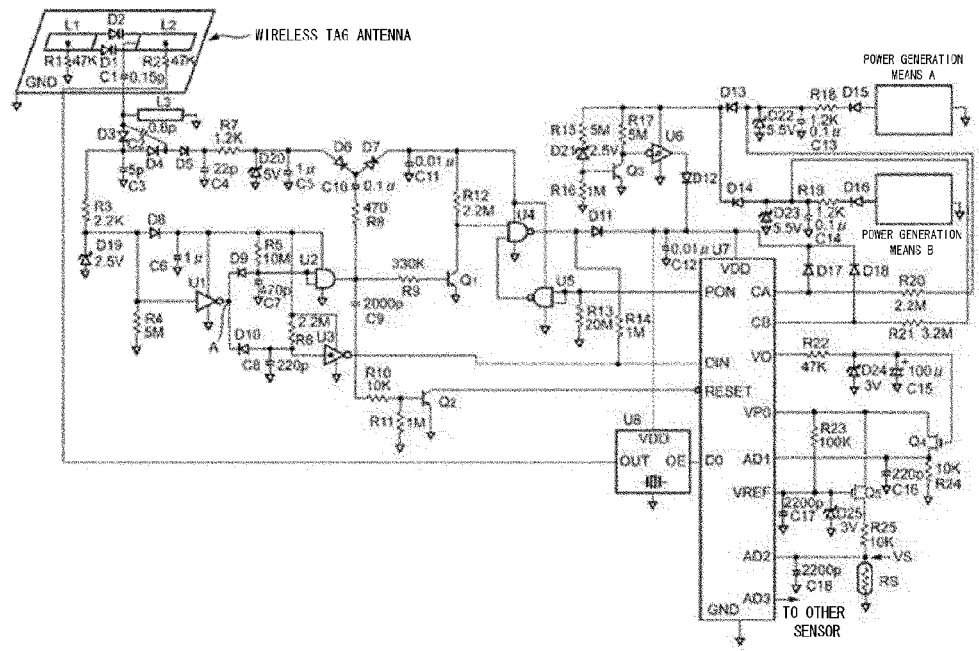
FIG. 1 is a circuit diagram of a conventional passive wireless tag device.
Figure 2:
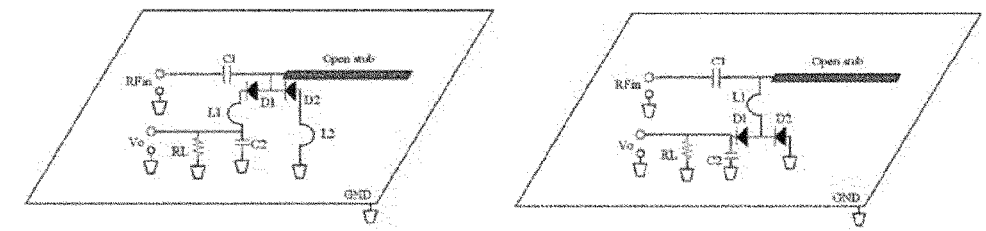
FIG. 2 illustrates examples of a microwave band booster rectifier circuit according to an embodiment of the present invention, being respective diagrams in which (a) is a circuit example 1, (b) is a circuit example 2, and (c) is a circuit example 3 and a passive system ASK demodulation circuit.
Figure 2:
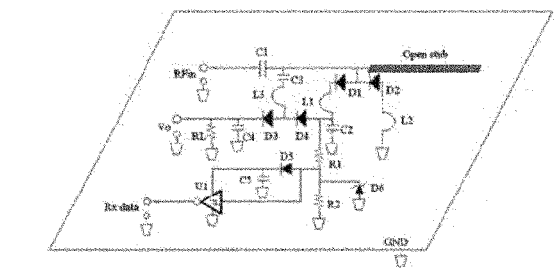
Figure 6:
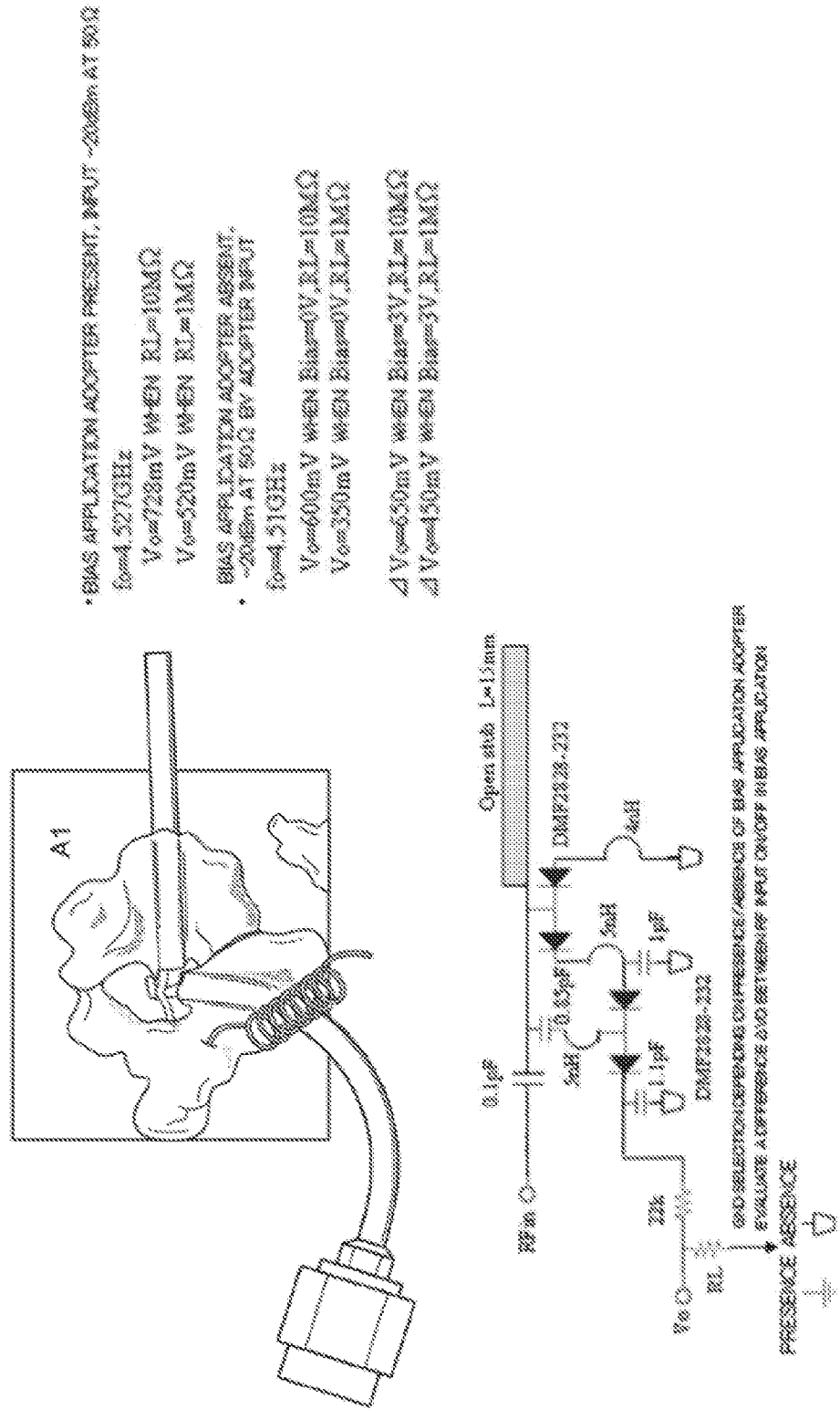
FIG. 6 illustrates a photograph and a circuit diagram of a test evaluation board example 1 (A1) of a microwave band booster rectifier circuit.

FIG. 6 is an example of a microwave frequency band booster rectifier circuit of the present invention, corresponding to (c) in FIG. 2. Although, in this figure, a disengageable semi-rigid cable is used in the λg/2 open stub, since loss caused by electromagnetic wave radiation from a disengaged fringe part is expected, a copper pipe part is added so as to extend the disengaged part.

In a passive wireless tag operation without a bias application adopter that fo=4.527 GHz of −20 dBm has been directly applied to RFin at 50Ω in the circuit in FIG. 6, it can be estimated that the open detection output voltage is about 762 mV and the output impedance is about 465 kΩ. In addition, in a semi-passive wireless tag operation, although the RF signal has been applied via the bias application adopter, such degradation of performance is observed that the open detection output voltage is about 652 mV and the output impedance is about 862 kΩ when Bias in=0V. It is thought that a reduction in the detection output voltage is caused by attenuation of the RF signal level by the bias application adopter, and it is thought that an increase in the output impedance is caused by addition of a DC bias output impedance component of the bias application adopter. In addition, in the case of Bias in=3V, although effect of bias application is recognized such that the open detection output voltage (a change amount $\Delta V_0$ of the detection output voltage when an applied RF signal has been turned ON/OFF at 100 KHz has been evaluated because the DC bias voltage is offset by the detection output signal) is about 684 mV and the output impedance is about 519 kΩ, degradation of performance is more confirmed than in a case where the bias application adopter is not used. As described above, although it is thought that insertion of the bias application adopter used in the semi-passive wireless tag operation has the opposite effect, if about 100 m is supposed as a communication range of the semi-passive wireless tag, the received signal level by the wireless tag will amount to about −60 dBm, and therefore it is thought that the detection output will not be obtained at all without the bias application operation of the detection diode.

Figure 7:
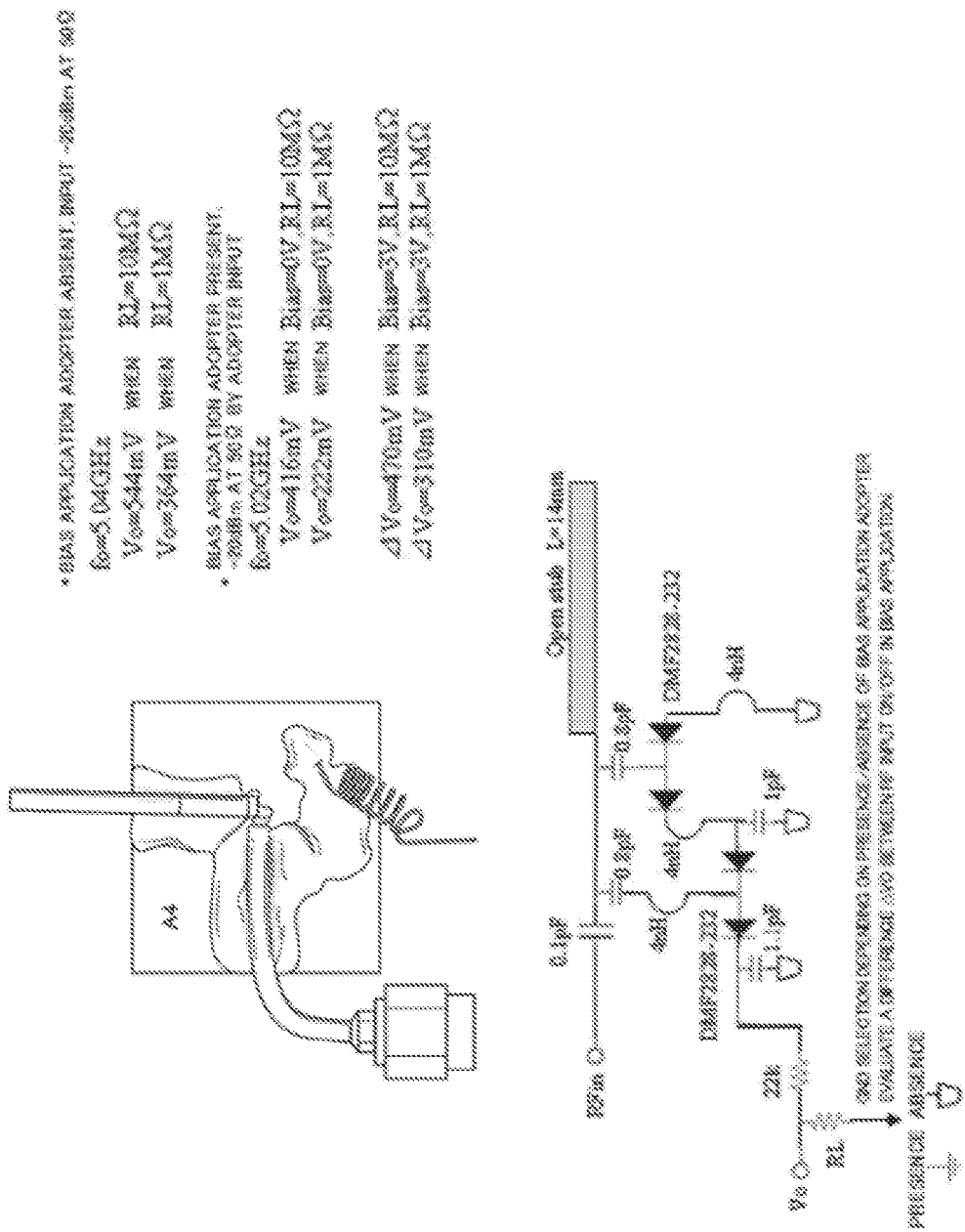
FIG. 7 illustrates a photograph and a circuit diagram of a test evaluation board example 2 (A4) of the microwave band booster rectifier circuit.

FIG. 7 is an example that a capacitor of 0.8 pF is added to connection between the common of detection diodes D1 and D2 and the stub in the circuit shown in (c) of FIG. 2. This capacitor addition is performed in order to apparently reduce the capacitance of the stub viewed from the detection circuit for the purpose of avoiding that in a case where the capacitance of the open stub is comparatively large, it configures a first order delay system together with the detection output signal impedance to make fast fetching of an ASK demodulated signal difficult. In the passive wireless tag operation (the bias application adopter is absent) at a 50Ω, −20 dBm, fo=5.04 GHz input of this circuit, it can be estimated that the open detection output voltage is about 576 mV and the output impedance is about 581 kΩ. In addition, in the semi-passive wireless tag operation, although the RF signal has been applied via the bias application adopter, in the case of Bias in=0V, the open detection output voltage was about 461 mV and the output impedance was about 1075 kΩ, and in the case of Bias in=3V, the open detection output voltage was about 499 mV and the output impedance was about 608 kΩ. All of these values are worse than those in the case of the circuit in FIG. 6 and it is found that the capacitor to be inserted into the microwave band RD signal entails comparatively great loss.

Figure 8:
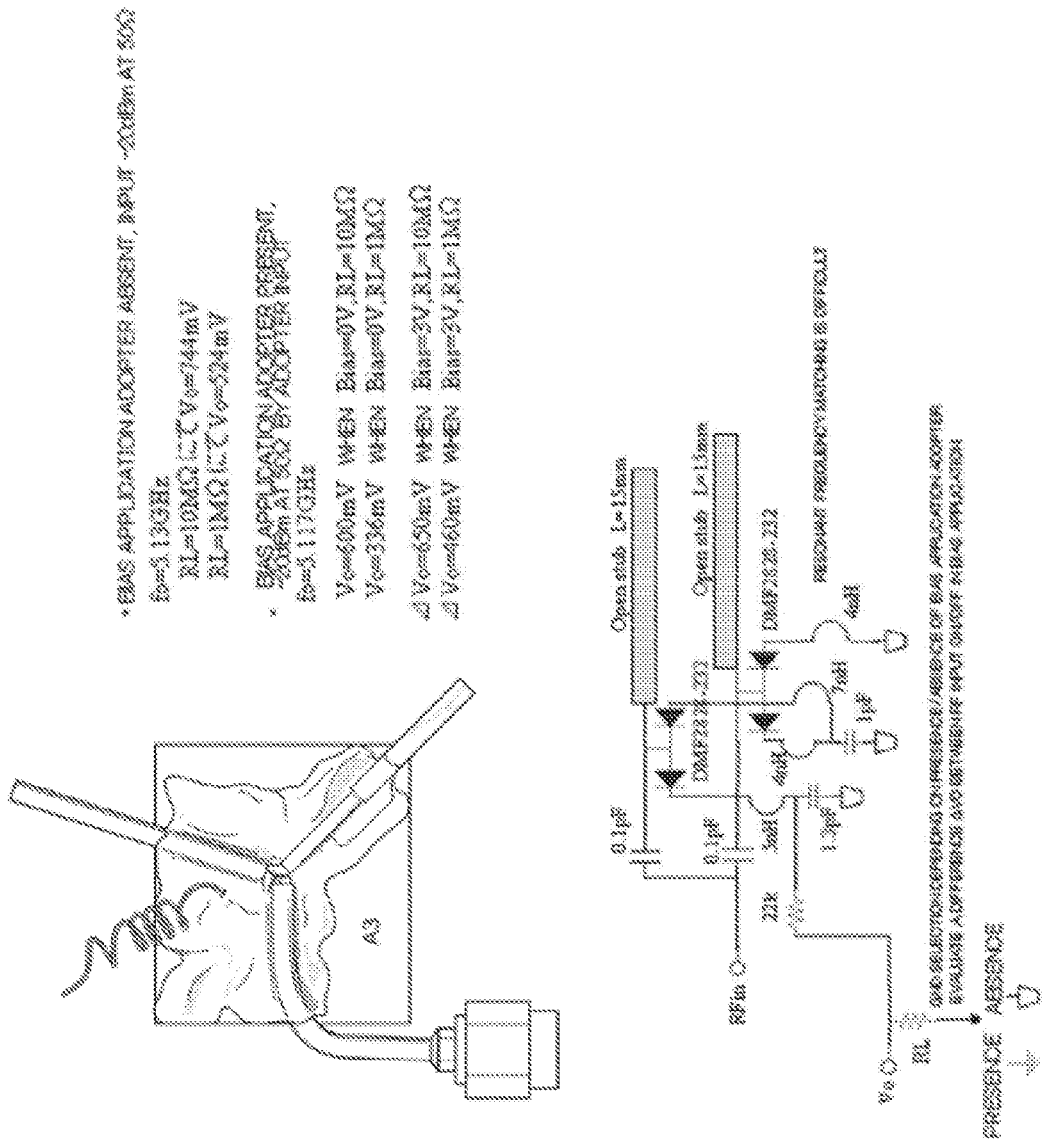
FIG. 8 illustrates a photograph and a circuit diagram of a test evaluation board example 3 (A3) of the microwave band booster rectifier circuit.

FIG. 8 is an example that a voltage-quadrupler rectifier detection circuit of the stub boosted RF signal is configured by combining together (a) and (b) of FIG. 2. In the passive wireless tag operation (the bias application adopter is absent) at a 50Ω, −20 dBm, fo=5.13 GHz input of this circuit, it can be estimated that the open detection output voltage is about 780 mV and the output impedance is about 489 kΩ. In addition, in the semi-passive wireless tag operation, although the RF signal has been applied via the bias application adopter, in the case of Bias in=0V, the open detection output voltage was about 657 mV and the output impedance was about 957 kΩ, and in the case of Bias in=3V, the open detection output voltage was about 681 mV and the output impedance was about 481 kΩ. From these results, it can be said that the values of the open detection output voltage and output impedance in respective operation modes of the circuit in FIG. 8 are almost the same as those in the case of the circuit in FIG. 6. In the circuit in FIG. 8, a method of adding together output voltages of respectively independent stub booster rectifier circuits is adopted and it is expected to realize a higher boost ratio by eliminating the capacitor to be inserted into between the stub boosted RF signal and the detection diode. However, when it is intended to match resonance frequencies of two systems, such a phenomenon also occurs that the detection output voltage is rather reduced and therefore the value of the inductor to be loaded on the diode is so selected as to mismatch the resonance frequencies of the two systems.

Figure 9:
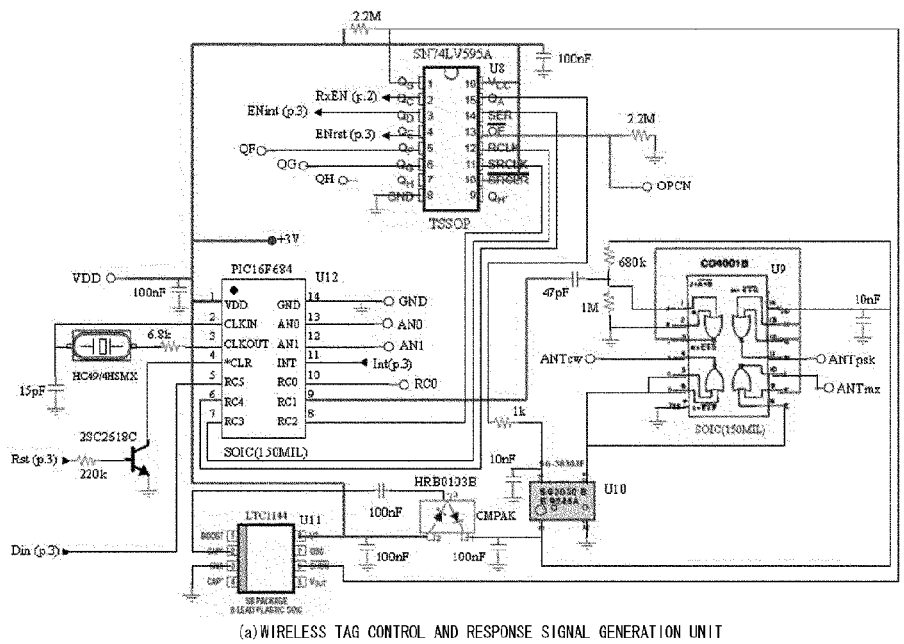
FIG. 9 is a circuit diagram of a wireless tag control and response signal generation unit of a semi-passive type wireless tag according to an embodiment of the present invention.
Figure 10:
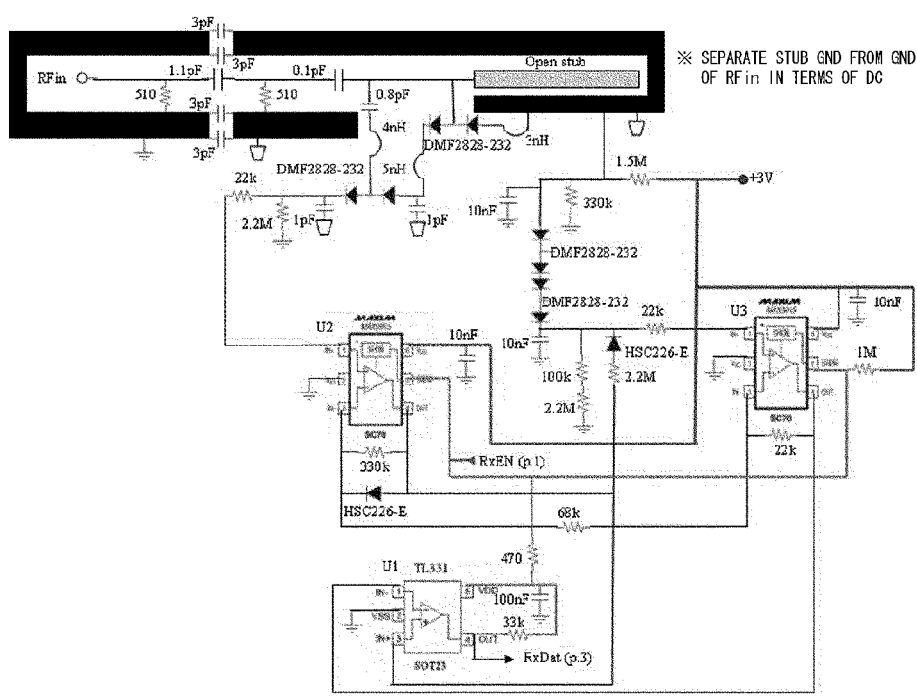
FIG. 10 is a circuit diagram of a received signal boosting rectification detection and ASK demodulation unit of a semi-passive type wireless tag according to an embodiment of the present invention.
Figure 11:
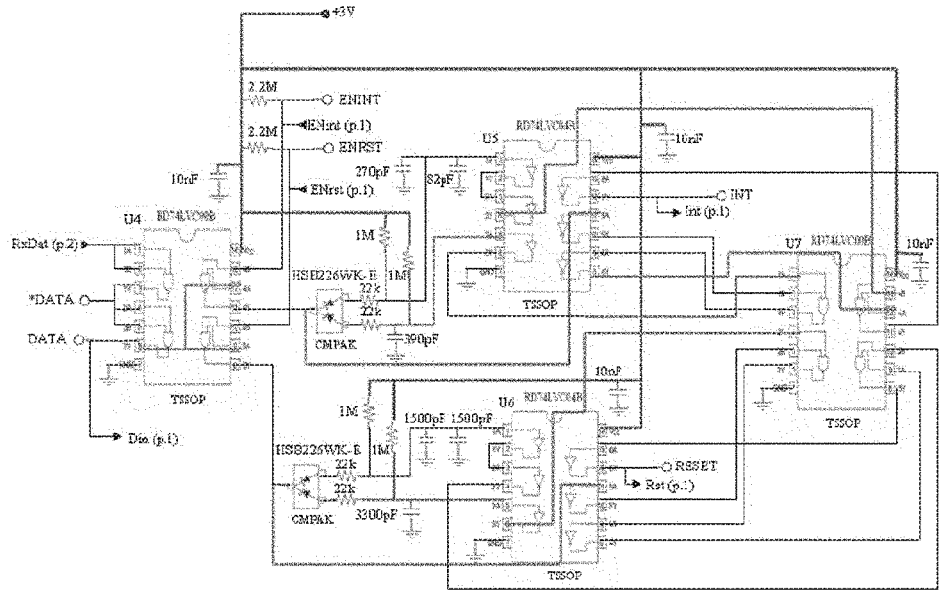
FIG. 11 is a circuit diagram of a pulse coding key detection unit of a semi-passive type wireless tag according to an embodiment of the present invention.

FIG. 9 to FIG. 11 are circuit diagrams of the microwave band semi-passive type wireless tag proposed by the present invention and it operates at 5 GHz. This circuit is configured by (a) a wireless tag control and response signal generation unit in FIG. 9, (b) a received signal boost rectification detection and ASK demodulation unit in FIG. 10, and (c) a pulse coding key detection unit in FIG. 11. First, (b) the received signal boost rectification detection and ASK demodulation unit which includes the microwave band booster rectifier circuit according to the present invention will be described.

Figures 3, 4:
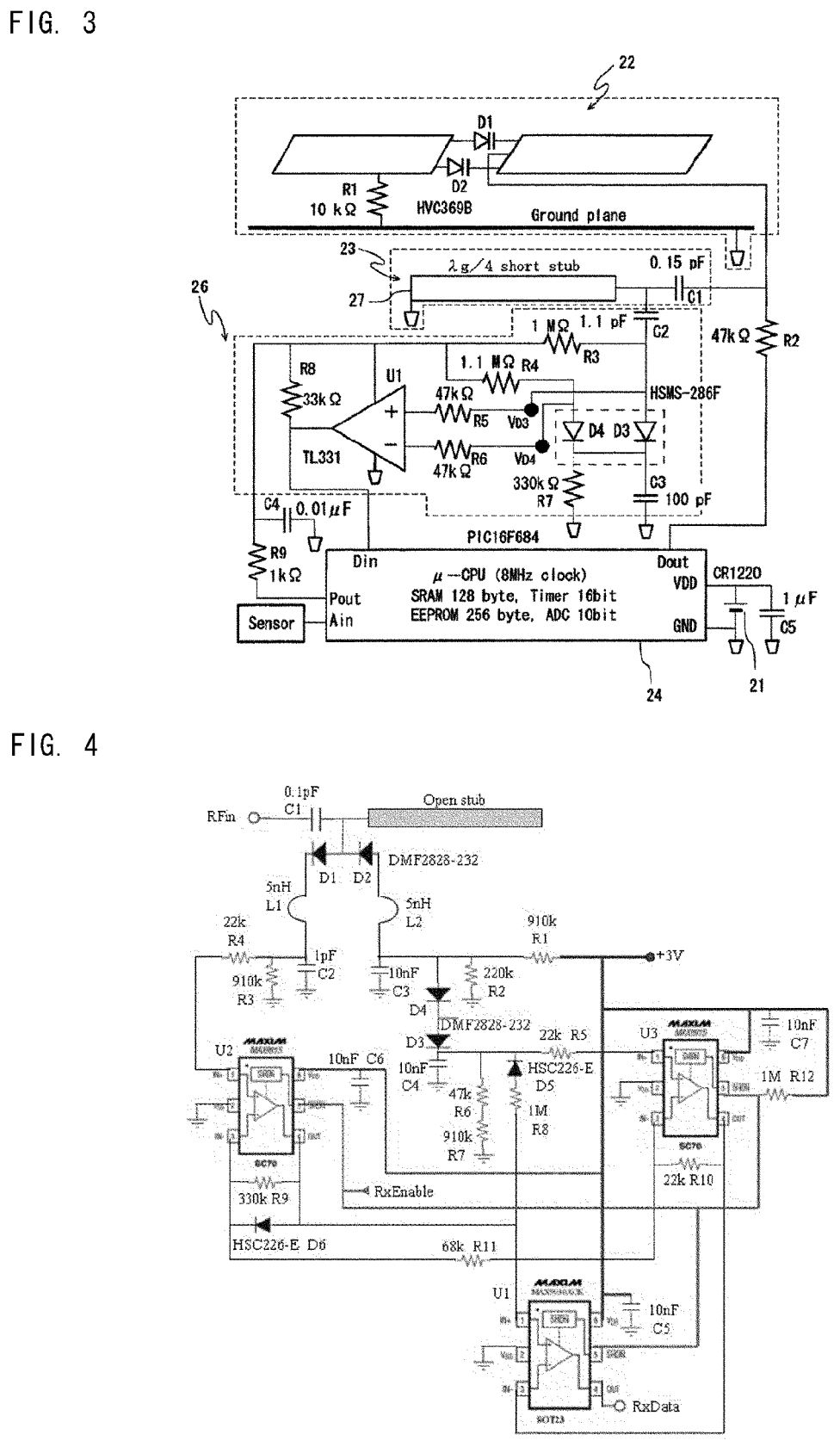

This circuit is configured by the bias application adopter unit shown in FIG. 5, the λg/2 open stub resonance booster circuit and the voltage-quadrupler rectifier circuit shown in FIG. 6, and the ASK demodulation circuit including reception AGC and threshold value control shown in FIG. 4. (c) is the circuit of the patent that the inventors have applied before and is characterized by responding only to signals of a fixed pulse-width range and operating with low power consumption, and its operational principle is described in Patent Document 2. In this circuit, an output INT of U5 outputs a pulse signal of about 2 μs in width in response to received signal pulse widths 260 μs to 350 μs, and an output RESET of U6 outputs a pulse signal of about 20 μs in width in response to received signal pulse widths 2.5 ms to 3.2 ms. Finally, (a) is a part for performing received command analyzing and responding operations of the wireless tag using the microwave band booster rectifier circuit according to the present invention, U9 is an amplitude level converter for obtaining a 0-5V antenna drive amplitude for a response from the tag to the reader, and ANTpsk, ANTcw and ANTmx are respectively connected to the varactor diode loaded on the tag antenna shown in FIG. 12 and FIG. 13. U10 is a CW oscillator of 32.768 kHz which is used for positioning the tag from the reader and is high in frequency stability, and its output signal is level-converted by U9 to drive the varactor diode loaded on the tag antenna, thereby reflecting and returning the query signal fo from the reader by a subcarrier of fo±32.768 kHz. On the reader side, the range can be obtained by complexly detecting a tag response subcarrier signal and observing a tag-to-reader reciprocal frequency response while performing frequency sweeping on the query signal fo. U11 is a DC-DC converter of a charge pump system which produces a 5V power source used in U9 from a 3V coin-cell battery which is built into the tag. U12 is a microprocessor into which an AD converter, a memory, WDT (a timer interrupt function which operates in a low power consumption mode) and the like are built. Pulse-type-based time interval measurement results and order can be recorded in U12 by interrupting the microprocessor to which the INT signal and the RESET signal of the previously shown (c) are connected and which is operating in a WDT mode with a specific received pulse. A result of this recording is a key for activating a specific tag, and a pulse coding key which has been transmitted from the reader and is adapted to activate the specific tag can be received while leaving U12 almost in a WDT mode standby state. Here, a pulse interval counter is incremented assuming that WDT of U12 occurs, for example, per 1 ms, and in a case where interruption with the received signal pulse has occurred, recording and resetting operations of the pulse interval counter and determination of a pulse code are performed. In addition, U12 which has been activated by an initializing operation and various kinds of interruption controls each output terminal of U8 to turn ON/OFF power sources of U10 and U11 and to switchingly control the operation modes in the tag. For example, RxEN brings U2 and U3 into active states to put the wireless tag in a receive mode, ENint brings an INT pulse detection circuit into the active state, and ENrst brings a RESET pulse detection circuit into the active state. In addition, an AD converter which is built into U12 digitizes a sensor output signal and the like, outputs it as an MPSK subcarrier modulated signal (see Patent Document 2) from an RC1 terminal and level-converts it by U9 to drive the varactor diode loaded on the tag antenna, thereby modulating and reflecting the query signal from the reader by the subcarrier to return sensor information.

Incidentally, a protocol of communication with the reader in the present wireless tag device operates in conformity to the following rules.

A) Transmission of a pulse key, a command and data from the reader to the wireless tag is performed by negative-logically ASK-modulating a 5 GHz band CW signal.

B) All wireless tags which have received a reset pulse key (PW=2.5-3.2 ms) transmitted from the reader side reset all the ever received operation commands back to initialized states and return CW response subcarrier signals of a fixed time width into slots which have been set in advance. The reader side recognizes the presence of the wireless tag by receiving this signal.

C) When no operation command is received, the wireless tag side, in general, (a) sets RxEN control to a Low level to bring the receiving circuit into an inactive state and sleeps using WDT to save the power consumption. It repeats the operations of performing restart by WDT after a fixed time has elapsed, (b) setting RxEN to a High level to bring the receiving circuit into the active state and setting ENrst to the High level to permit reception of a reset pulse key for a fixed time using WDT, and thereafter returning to (a). At that time, in order to initialize all the wireless tags with the reset pulse key to make them respond from the reader side, the reset pulse key is repeatedly transmitted in a time width exceeding the time interval of (a). In addition, the wireless tag which has received a command standby order in a power saving mode sets ENint to the High level, repeats the operations of (a) and (b) in a state of permitting reception of the interrupt pulse key to wait for reception of the command by the pulse coding key from the reader.

D) All the wireless tags which have received the interrupt pulse key (FW=260-350 µs) transmitted from the reader side and are not in interrupt disabled states read and record the time interval of the interrupt pulse key, counted values utilizing WDT and shift to the next operation in accordance with a command specified by a counted string which has been recorded.

E) For example, a minimum value (the counted value utilizing WDT is reduced to zero) of the intervals of the interrupt pulse keys transmitted from the reader side is used as start and end codes of the pulse coding key command and the operation of the wireless tag is controlled by a counted string utilizing WDT sandwiched between pulse keys of a minimum interval (FIG. 23).

F) In reading the ID code of the wireless tag from the reader side, a Manchester coding ASK masked ID code is transmitted after an ID code reading command using the interrupt pulse coding key, and the wireless tag having the corresponding ID code returns the ID code of itself into the slot which has been determined in advance (for example, the bit code of a mask part) to the reader side using subcarrier MPSK modulation. Incidentally, the Manchester coding masked ID code is input into Din of U12, demodulation and analysis of the Manchester code are performed by U12, and also response MPSK signals are synthesized by U12 to be output from an RC1 terminal (FIG. 24).

G) The masked ID code is an expected value ID code including a mask bit string, and although in a case where the expected value ID other than the masked bit position matches the ID of itself, that wireless tag returns the ID code of itself into the slot which has been determined in advance to the reader side by the subcarrier MPSK modulation, when there is no error in the received ID code, the reader side informs the wireless tag of completion of reading and transmits a command to instruct not to respond to the ID read command in future to the wireless tag (FIG. 25).

In addition, in a case where there was a read error (a collision with the response from another tag) in the ID code, the mask bit string is changed and the ID code read command is repeated until the error is eliminated. In addition, in order to determine completion of reading of all the wireless tags, the ID read command that all the bits are masked is transmitted to confirm that there is no response.

H) A short command pulse coding key is given to the wireless tag ID code reading from which has succeeded. Thereafter, that wireless tag can be operated only with the pulse coding key by interruption (FIG. 26).

Design of Tag System
(Fundamental Study)

Figure 12:
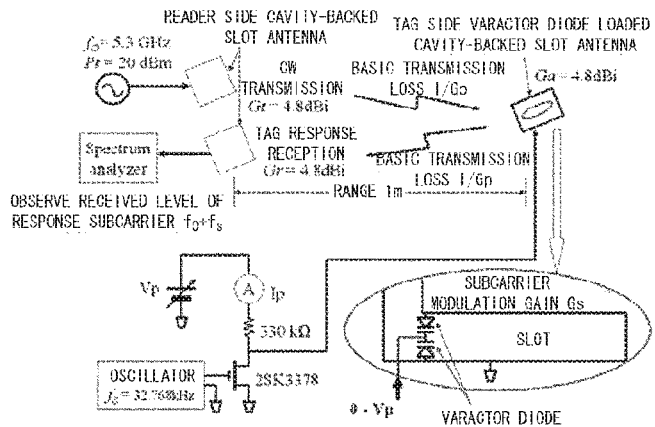
FIG. 12 is a conceptual diagram showing an evaluation experiment system of a consumption current Ip and a tag response received power relative to a tag antenna drive voltage Vp.

A simple evaluation system for a wireless tag system is shown in FIG. 12. In this figure, assuming that Pt is a transmitting power of the carrier signal to be transmitted from the reader side at the frequency fo, Gt is an actual gain of the transmitting antenna, Ga is an actual gain of the tag-side antenna, and 1/Gp is a basic transmission loss from the reader to the tag, a received power on the tag side Pa will be given by

[Numerical Formula 1]

$$Pa = PtGtGaGp \quad (1)$$

In this formula, assuming that c is a speed of light and r is a reader-to-tag range, the basic transmission loss 1/Gp in a free space will be given by

[Numerical Formula 2]

$$Gp = \left(\frac{c}{4\pi r f_o}\right)^2 \quad (2)$$

In addition, assuming that the signal that the tag has received is modulated with the subcarrier signal fs by the variable impedance element (the varactor diode) which is loaded on the varactor antenna, a reader-side received power Ps of a subcarrier response signal of fo+fs which is reradiated from the tag antenna will be

[Numerical Formula 3]

$$Ps = PaGrGsGasGps \quad (3)$$

as above. Here, Gs is a subcarrier modulation gain, Gr is an actual gain of the reader-side receiving antenna, Gas is an actual gain of the tag antenna in fo+fs, and 1/Gps is a basic transmission loss of the subcarrier response signal to the reader and is given by

[Numerical Formula 4]

$$Gps = \left(\frac{c}{4\pi r(f_o + f_s)}\right)^2 \quad (4)$$

Here, since fo>>fs is established, and $$Ga \approx Gas, Gp \approx Gps$$

the formula (3) can be approximated by

[Numerical Formula 5]

$$Ps \approx PtGtGr(GaGp)^2 Gs \quad (5)$$

Then, when the subcarrier modulation gain Gs in the formula (5) is considered, in a case where a square wave of 50% in duty ratio is assumed as the subcarrier modulation signal fs, from the product with the carrier signal fo, (a) in a case where the tag antenna repeats full absorption and total reflection of fo with fs,

[Numerical Formula 6]

$$Gs = \left(\frac{1}{\pi}\right)^2 \quad (6a)$$

(b) in a case where the tag antenna repeats total reflection of fo with the phase difference 180° with fs,

[Numerical Formula 7]

$$Gs = \left(\frac{2}{\pi}\right)^2 \quad (6b)$$

is given, and while the subcarrier modulation gain Gs is about −9.9 dB in the case of (a), it is about −3.9 dB in the case of (b).

The subcarrier modulation gain of the actual tag antenna has been evaluated.

Figure 13:
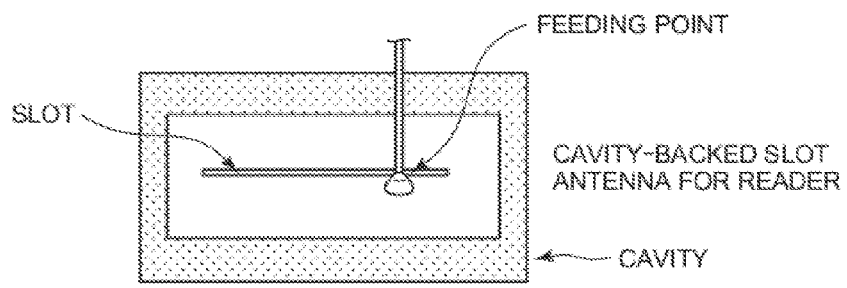
FIG. 13 illustrates photographs on a reader side antenna and a tag side antenna used in evaluation experiment of the tag response received power.
Figure 13:
Figure 13:
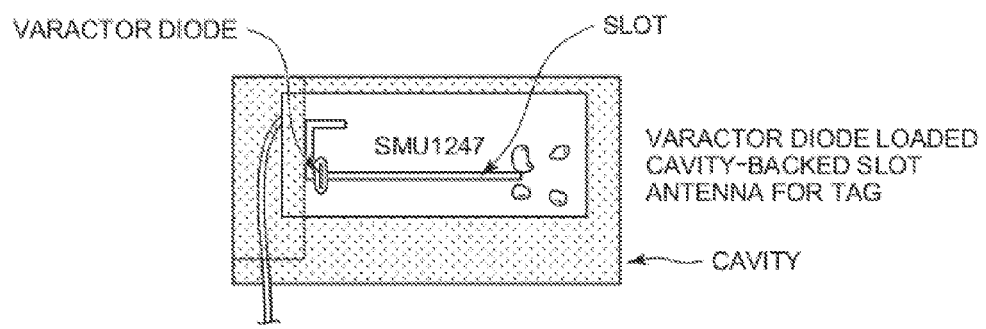
Figure 14:
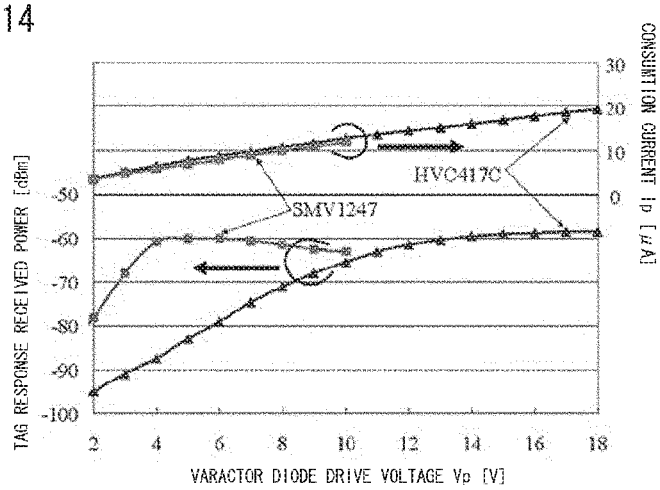
FIG. 14 is a graph diagram of the consumption current Ip and the reader side tag response received power relative to the tag side varactor diode drive voltage Vp.

Photographs of the actual reader-side antenna and tag-side antenna used in the evaluation system in FIG. 12 are shown in FIG. 13. The same antennas were used as the reader-side transmitting and receiving antennas and Gt=Gr=4.8 dBi was set. The reader-side antenna is 3 cm×6 cm in size and about 3 mm in thickness, is soft and can be integrated with a dress, and its actual gain is Ga=4.8 dBi. In addition, the reader-to-tag range was set to r=1 m. As varactor diodes to be loaded on the tag antenna, two kinds of diodes were used and comparison of characteristics was made. One is HVC417C and the other is SMV1247. In the evaluation system shown in FIG. 12, with fo=5.3 GHz, Pt=20 dBm, the square wave of 0↔Vp was applied to the varactor diode loaded on the tag antenna with the subcarrier signal fs=32.768 kHz, and the received level of fo+fs was observed on the reader side. FIG. 14 is a result of measurement of the reader-side received power Ps and the consumption current Ip of the varactor diode drive circuit relative to the drive voltage Vp of the varactor diode. From this figure, in the case of the tag using HVC417C, with Vp=18V, Ps=−58.5 dBm, and it almost matches a theoretical value −58.55 dBm using Ga=−3.9 dB of the formula (6b) in the formula (5). However, the consumption current of the varactor diode drive circuit at that time is Ip=19.4 µA and the power consumption amounts to about 350 µW. In addition, in a case where SMV 1247 is used, Ps=60 dBm when Vp=5V and it almost matches the value of substitution of Gs=5.4 dB into the formula (5). Therefore, in this case, it is thought that it is operating under an intermediate condition between the formula (6a) and the formula (6b). In addition, at that time, the consumption current of the varactor diode drive circuit is Ip=6.9 µA, and the consumption power was about 34.5 µW which is lower than 1/10 of the case using HVC417C.

While SWV1247 (with Vp=0–5V, Cj=9–0.7 pF, Rs=9–3.5Ω) is large in Cj–V change rate in comparison with HPC417C (with Pp=0–18V, Cj=8–0.7 pF, Rs=2–0.5Ω) and low voltage driving is possible, since its resistance component Rs is large, absorption loss occurs and the subcarrier modulation efficiency is reduced by about 30%.

(Tag)

A basic configuration of the sensor wireless tag which has been developed is shown in FIG. 9. In this tag, the MPSK subcarrier modulated signal of fs=125 kHz and Pp=5V is applied to the varactor diode (SMV1247) loaded on the tag antenna shown in FIG. 12 and FIG. 13 by PIC16F684 (µ-CPU) to control it. As for the multiplexing rate of MPSK, a variable rate system of 40 kbps for 4-value PSK, 60 kbps for 8-value PSK and 80 kbps for 16-value RSK is used. In data transfer at that time, input signals of sensors AN0, AN1 and RC0 are digitized by the AD converter which is built into the µ-CPU and are packetized together with each CH-ID code in units of 3 CHs and returned to the reader side. In addition, in the ranging operation, a non-modulated subcarrier signal is returned in a burst state and the received subcarrier signal fs is DFT-processed on the reader side while sweeping the transmit frequency fo on the reader side, thereby obtaining the reader-to-tag reciprocal frequency response.

As for command and tag ID designation information from the reader side, the received RF signal is resonant-boosted by a micro-capacitor of 0.1 pF and the λg/2 open stub, is voltage-quadrupled rectified detected by four-stage cascade-connected DMF, is subjected to AGC amplitude control and threshold value control by the operational amplifiers U2 and U3, and thereafter is binarized by the comparator U1 and analyzed by the μ-CPU. As for information from the reader side, the Manchester coding ASK signal is transmitted by laying it on the carrier fo at 100 kbps.

In the formula (1), when the reader-to-tag range r=30 m, fo=5.3 GHz, Pt=20 dBm and Gr=3 dBm on the reader side, and the tag antenna actual gain is 3 dBi, the tag-side received power Pa amounts to about −50 dBm (about 0.67 mV at 50Ω). Since it is necessary to use TL331 (300 μA in 3V operation) U1 in the comparator for receiving the Manchester code of 100 kbps, and an input amplitude of at least 5 mV is needed when taking offset into account, the performance of the order of about 10 times is required as the stub resonant boot ratio. While the stub resonant booster circuit in Patent Document 2 could only obtain a boost ratio of the order of 3 times in the 5 GHz band, in the design of the tag receiving circuit of the present invention, the Q value was placed at 200 or more by placing the junction capacitances of the resonant capacitor and the detection diode with the stub at about 0.1 pF and by using the open stub. In addition, an RF boost ratio of the order of about 10 times could be obtained by taking the wired inductor into account. In addition, in a case where a real-time response operation is needed with low power consumption in waiting for command and ranging trigger from the reader or the like, the sleep-state μ-CPU was interruptively activated by using the pulse detection circuit invented in Patent Document 2 so as to detect the key code.

(Reader)

Figure 15:
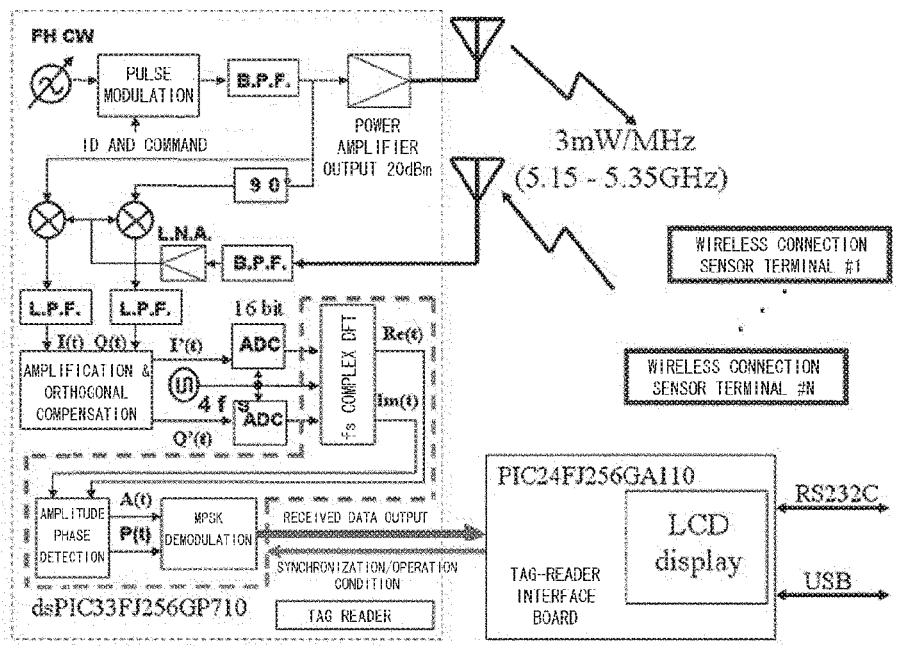
FIG. 15 is a configuration conceptual diagram of a sensor system according to an embodiment of the present invention.

A configuration of the sensor tag system which has been developed is shown in FIG. 15. In this figure, the tag generates a subcarrier signal which has been frequency-offset by ±fs relative to the query carrier fo transmitted from the reader and returns data by MPSK. The response subcarrier signal from the tag which has been received by the reader is orthogonally detected with the query carrier signal and is converted into a complex signal of ±fs with I(t) and Q(t), and thereafter only a +fs component is subjected to complex DFT processing to demodulate the return data from the tag. Here, fs=125 kHz and as the return data from the tag, 4-value PSK (40 kbps), 8-value PSK (60 kbps) and 16-value PSK (80 kbps) can be received and a transfer rate is selected in accordance with reception errors. In addition, the range of 5.15-5.35 GHz of the query carrier frequency fo is hopped in conformity with the standards of 5 GHz band wireless LAN so as to attain a transmitting power of about 3 mW/MHz. Further, since the tag response received power Ps on the reader is inversely proportional to the fourth power of the reader-to-tag range r as shown by the formula (2) and the formula (5), in a case where, for example, a range of r=1-30 m is set as a target, Ps changes by about 60 dB. Taking a received CN ratio of 15 dB and a fading margin of about 15 dB into account, a dynamic range of at least 90 dB is needed for an I-Q signal sampling AD converter used in the reader and a 12-bit AD converter which is built in dsPIC33FJ256 is insufficient. In the experimentally manufactured reader, 16-bit AD7621 was used as the AD converter and the sampling frequency could be increased to 4 fs=500 kHz.

(Configuration of Sensor Tag System)

In the ranging operation, the transmit frequency fo=5.15-5.35 GHz is controlled and swept by dsPIC33FJ256GP710 and the non-modulated response subcarrier signal fs from the tag per carrier frequency is subjected to complex DFT processing to observe the reader-to-tag frequency response characteristics (256 points in the 200 MHz band width), and this data is subjected to inverse Fourier transformation (IFFT) processing, thereby obtaining the reader-to-tag range r. In the experimentally manufactured reader device, observation (buffering of a result of the complex DFT processing) of the frequency response, block-scaling (needed for fixed-point arithmetic operation) of observed data, IFFT processing and peak search and ranging interpolation processing are batch-processed within dsPIC33FJ256GP710, and ranging result and IFFT data are transferred to an tag-reader interface board (PIC24FJ256GA110) in real time via an 8-bit parallel bus so as to be displayed. In this device, although the frequency response characteristics in the 200 MHz band width are observed, the observation resolution is limited to 75 cm simply by the IFFT processing of the observed data. Therefore, interpolation processing (Non Patent Document 3) is performed on the result of the IFFT processing. This is a method of performing IFFT processing by applying a Hanning window on the observed data, performing interpolation utilizing a trigonometric function on response amplitudes of a peak and both sides thereof to estimate true response position and amplitude, by which the ranging resolution 1 mm is attained. In addition, the result of ranging by the reader is output 30 times per second in maximum, in which 28 ms is used for observation of the frequency response, 4.5 ms is used for arithmetic processing and 0.5 ms is used for data output.

Figure 16:
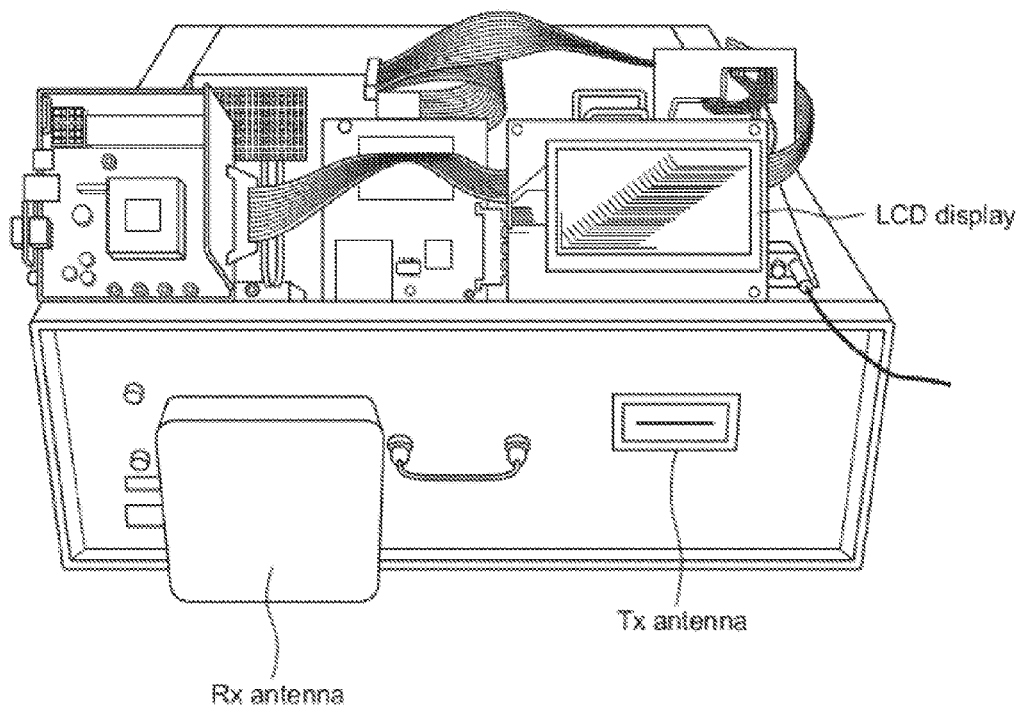
FIG. 16 is a photograph of a reader device according to an embodiment of the present invention.

A photograph of the experimentally manufactured reader device is shown in FIG. 16. In this photograph, a cavity-backed slot antenna of the actual gain Gt=4.8 dBi was used as the transmitting antenna to output Pt=20 dBm so as to have an EIRP value of not more than 25 dBm. In addition, a four-element patch array antenna of the actual gain Gr=14 dBi was used as the receiving antenna such that the tag response received power Ps on the reader amounts to at least −110 dBm with r=30 m so as to ensure a CN ratio of at least 15 dB in receiving data with the 4-value PSK40 kbps. The LCD display example in the photograph in FIG. 16 is a stacked display of a result of ranging IFFT so as to observe and evaluate a multipath reception state in real time when the tag has been continuously moved.

System Evaluation (Ranging Operation)

Figure 17:
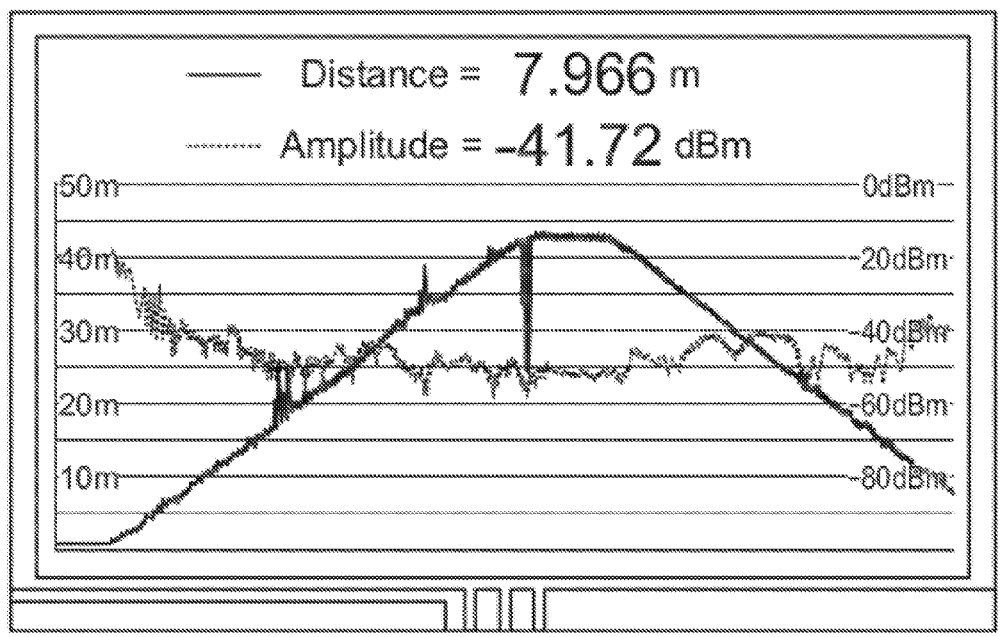
FIG. 17 is a photograph showing a ranged value and a tag response received signal level continuously measured while changing a reader-to-tag range.
Figure 18:
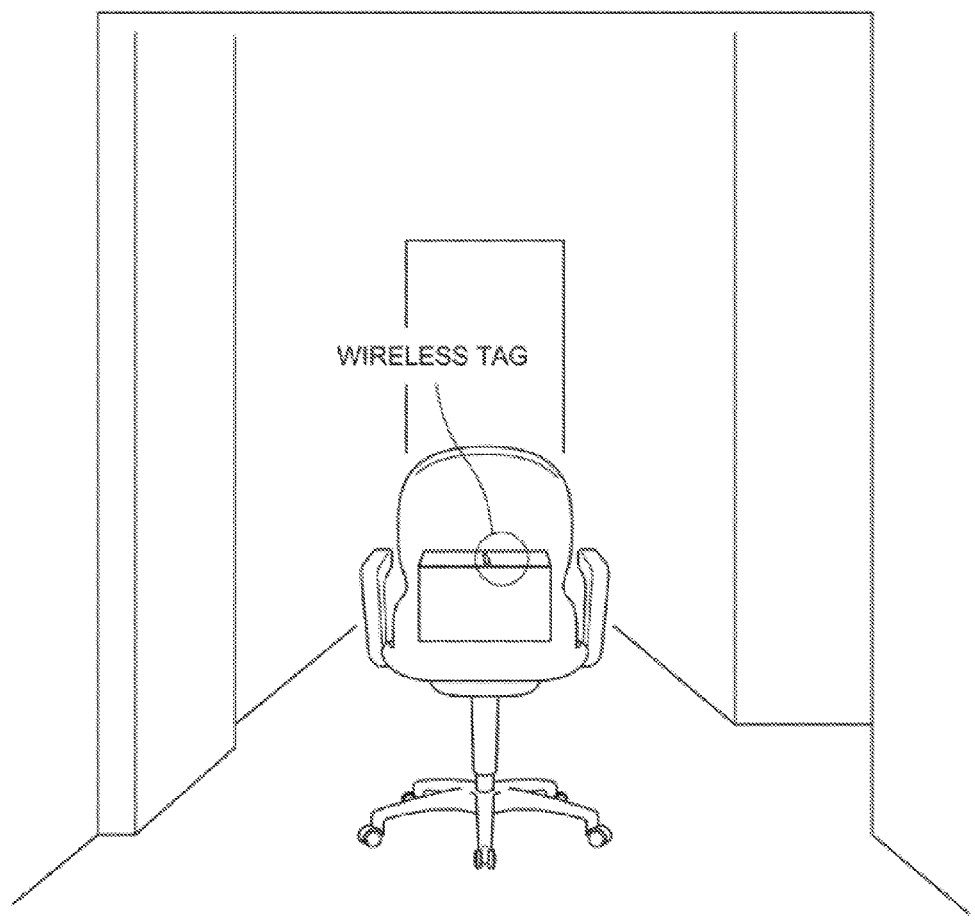
FIG. 18 is a photograph of a tag system evaluation experiment environment.

FIG. 17 is a result of ranging experiment on the wireless tag which has been performed using the experimentally manufactured reader device shown in FIG. 16, and FIG. 18 is a photograph of an experiment environment. In this experiment, the wireless tag was put on a chair with casters and was continuously moved along a corridor, on the reader side, the tag-to-reader range was ranged at intervals of 50 ms and ranged values and received power values were LCD-displayed and recorded in real time on the reader side. Observation was evaluated by reciprocatingly and continuously moving it along the 43 m corridor. From this figure, it is found that ranging is almost correctly performed within a range of r=1-43 m of the wireless tag-to-reader range. However, when looking at the ranging graph in FIG. 17, several data hopped places can be confirmed when the tag moves away from the reader. This is because there was movement of a person at a position where the tag is perfectly obstructed and data hopping is not observed when the tag moves toward the reader. Although, when looking at the tag response received level on the reader, influence of level fluctuation caused by multipath fading can be confirmed in the graph of the observed received power, in ranging algorithm, estimation of direct waves is performed by taking not only a maximum peak of the result of IFFT but also a runner-up candidate for the peak which is shorter in delay time into account.

{MPSK Data Transfer}

Figure 19:
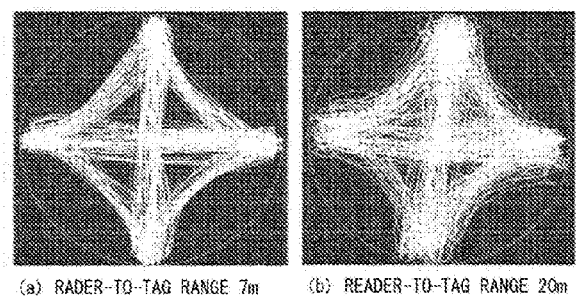
FIG. 19 illustrates diagrams of received I-Q constellations when the reader-to-tag ranges have been set to 7 m and 20 m in 4-value PSK response.
Figure 20:
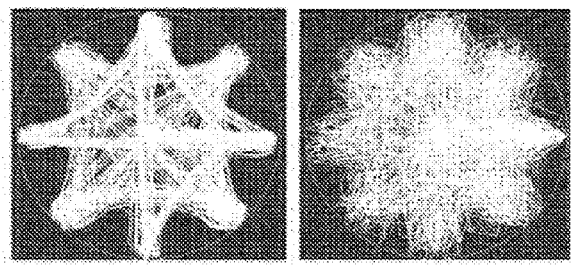
FIG. 20 illustrates diagrams of received I-Q constellations when the reader-to-tag range has been set to 7 m and 20 m in 8-value PSK response.
Figure 21:
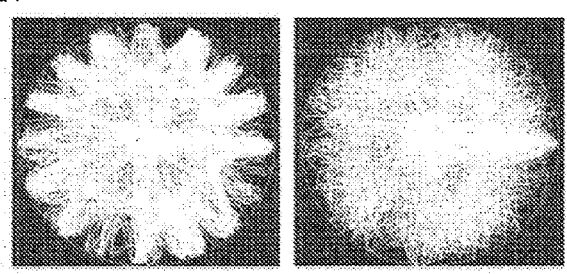
FIG. 21 illustrates diagrams of received I-Q constellations when the reader-to-tag range has been set to 7 m and 20 m in 16-value PSK response.

FIG. 19 to FIG. 21 are results of experiments on received I-Q constellation observation performed in order to evaluate the influence of a variable multiplexing rate phase modulation system on reception errors. In a case where the reader-to-tag range is r=7 m and in a case where it is r=20 m respectively, FIG. 19 shows a case of the data rate of 40 kbps in 4-value PSK modulation, FIG. 20 shows a case of the data rate of 60 kbps in 8-value PSK modulation and FIG. 21 shows a case of the data rate of 80 kbps in 16-value PSK modulation. Looking at these experimental results, it can be guessed that with r=7 m, error-free reception is possible in the cases of the 4-value PSK and the 8-value PSK, and BER of not more than 1% is possible also in the case of the 16-value PSK. While, with r=20 m, error-free is possible in the case of the 4-value PSK, occurrence of reception errors can be guessed in the case of the 8-value PSK though BER is not more than 1%. In addition, it is found that in the 16-value PSK with r=20 m, demodulation is almost difficult.

Figure 22:
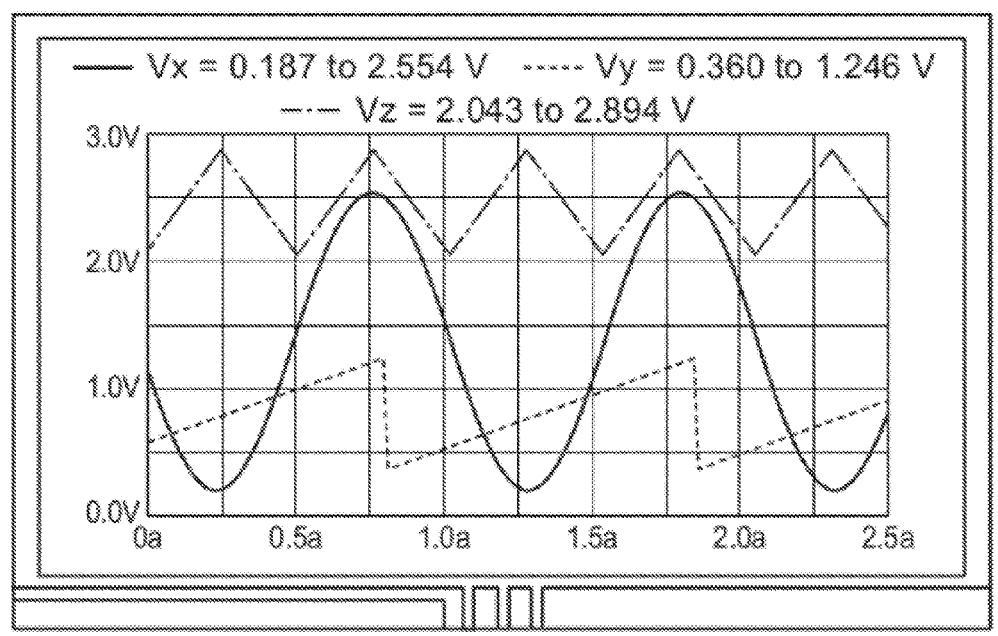
FIG. 22 is a diagram showing a real time LCD display example of continuously received data with a reader-to-tag range of 30 m.

FIG. 22 is a display example of real time LCD monitoring of a result of data transfer with r=30 m by applying a sine wave, a triangle wave and a saw tooth wave of different frequencies and levels to a 3CH analog input of the experimentally manufactured sensor wireless tag and using the reader in FIG. 16. In data transfer, the 4-value PSK 40 kbps is used and it is found that it can be received in error-free.

In the present embodiment, in order to attain range lengthening and consumption power reduction of the 5 GHz band sensor tag, the basic study relating to propagation and response efficiency and the study of the tag and reader configurations have been made. The sensor wireless tag system which has been developed is the sensing data transfer system which performs the ranging operation 30 times per second and operates at 40-80 kbps, and the tag antenna is 3 cm×6 cm in size and about 3 mm in thickness and is soft, and its integration with a dress is also possible. In addition, the consumption currents of the built-in 3V coin-cell battery in continuous operation are 30 µA and 600 µA in the respective operations of ranging and data transfer and the power consumption could be reduced to about 1/100 in comparison with the conventional active sensor wireless tags of Bluetooth (registered trademark) and ZigBee systems. Further, the reader which has been developed operated in conformity with the 5 GHz band wireless LAN standards and the ranging and data transfer operations exceeding 30 m were confirmed with the reader output of 20 dBm.

The invention claimed is:

1. A microwave frequency band stub resonance booster circuit, comprising:
   an RF signal input terminal;
   an RF boosted signal output terminal;
   a micro-capacitor element of 0.01 pF to 0.2 pF; and
   a $\lambda g/2$ open stub element, wherein
   the micro-capacitor element and the $\lambda g/2$ stub element resonate in series to carry out impedance conversion of an input RF signal to suppress electromagnetic wave radiation,
   an amplitude of the input RF signal boosted,
   wherein
   a boost ratio is between 19 times to 33 times,
   an anode or cathode terminal of a rectifier diode element and a terminal of a rectifier diode element opposite to that of the rectifier diode element in polarity connect to a connection point between said micro-capacitor element and open stub element,
   an unconnected terminal of the rectifier diode element connects to an RF signal ground level part,
   an unconnected terminal of the rectifier diode element connects to a capacitance element for rectified output to charge the rectifier diode element to obtain boosted rectified output of the RF input signal,
   insertion of a capacitor required to voltage-doubling rectifier circuit becomes unnecessary because the open stub is in a DC and open state in order to eliminate energy loss due to the inserted capacitor, by which high Q value not obtain, in the microwave band, and
   insertion of a capacitor necessary for bias application not needed because DC conductance of a connection point, which is an output terminal of the RF boost signal and lies between the micro-capacitor element and the $\lambda g/2$ open stub element.

2. The microwave band booster rectifier circuit according to claim 1, wherein an anode or cathode terminal of a rectifier diode element and a terminal of a rectifier diode element which is opposite to that of the rectifier diode element in polarity are connected to a connection point between said micro-capacitor element and open stub element, an unconnected terminal of the rectifier diode element is connected to an RF signal ground level part, an unconnected terminal of the rectifier diode element is connected to a capacitance element for rectified output to charge the rectifier diode element to obtain boosted rectified output of the RF input signal, high Q value does not obtain, in the microwave band, and
   insertion of a capacitor required to voltage-doubling rectifier circuit becomes unnecessary because the open stub is in a DC and open state in order to eliminate energy loss due to the inserted capacitor.

3. The microwave band booster rectifier circuit according to claim 2, wherein output of another booster rectifier circuit, separated from the original booster rectifier circuit with direct current and a resonance frequency of which is also different, is used as the RF signal ground level part.

4. A microwave frequency band stub resonance booster circuit, comprising:
   an RF signal input terminal;
   an RF boosted signal output terminal;
   a micro-capacitor element of 0.01 pF to 0.2 pF; and
   a $\lambda g/2$ open stub element, wherein
   the micro-capacitor element and the $\lambda g/2$ stub element resonate in series to carry out impedance conversion of an input RF signal to suppress electromagnetic wave,
   an amplitude of the input RF signal boosted,
   wherein an anode or cathode terminal of a rectifier diode element and a terminal of a rectifier diode element which is opposite to that of the rectifier diode element in polarity are connected to a connection point between said micro-capacitor element and open stub element, an unconnected terminal of the rectifier diode element is connected to an RF signal ground level part, an unconnected terminal of the rectifier diode element is connected to a capacitance element for rectified output to charge the rectifier diode element to obtain boosted rectified output of the RF input signal, not obtain, in the microwave band,
   wherein an inductance element, which resonates in series with a junction capacitance of the rectifier diode, inserted into one side of the rectifier diode element in order to reduce the rectifier diode junction capacitance of said rectifier diode element works as a capacitive load on boosted output of said RF signal amplitude, and of inducing a higher RF signal amplitude by the rectifier diode element; and each value of the inductance element inserted to the respective diode element shifts, and a resonance frequency of the each diode element does not overlap and a rectified output of RF signal with higher amplitude is obtained, insertion of a capacitor necessary for bias application not needed because DC conductance of a connection point, which is an output terminal of the RF boost signal and lies between the micro-capacitor element and the $\lambda g/2$ open stub element, and insertion of a capacitor required to voltage-doubling rectifier circuit becomes unnecessary because the open stub is in a DC and open state in order to eliminate energy loss due to the inserted capacitor.

5. The microwave band booster rectifier circuit according to claim 2, wherein a direct current bias source used as said RF signal ground level part to flow forward bias current into said rectifier diode, a ground of a detection circuit of the RF input signal and the received signal, and a ground of the stub resonance booster circuit connect with a resistance having high value and a condenser in parallel to obtain a detected output for a weak RF input signal, and weak DC current is supplied to the resistance and the rectifier diode has forward bias.

6. The microwave band booster rectifier circuit according to claim 5, wherein in an ASK demodulation supplying bias current to a diode group separated from an RF signal by a microwave band booster rectifier circuit to determine either the presence or absence of the RF signal in accordance with a difference in output potential, a wireless tag device promoting acceleration of ASK demodulation promoted by adding an output average voltage on a side of the microwave band booster rectifier circuit to an output of a diode group separated from the RF signal.

7. The wireless tag device according to claim 6, wherein at least one kind of pulse width detection circuit connected to said ASK demodulation output to make a control circuit which operates as a standby timer execute interruption processing with output from the pulse width detection circuit, and standby for pulse string code reception of a received RF signal by a combination of an inter-pulse time measurement result by the timer is performed with the pulse type with low power consumption.

8. A wireless tag system, wherein a wireless tag specified by a standby for pulse string code reception according to claim 7 is activated, and a CW subcarrier response signal using a stabilized, high frequency built-in oscillation source returns to a reader side for a fixed time, whereby the reader side sweeps a query frequency within the fixed time to observe a tag-to-reader reciprocal frequency response, thereby obtaining a position of a specified tag is obtained from the reader.

9. The wireless tag system according to claim 8, wherein a wireless tag specified by said standby for pulse string code reception activated, and a result of measurement by a sensor is digitized for a fixed time and is transferred to a reader side by subcarrier MPSK.

10. The wireless tag system according to claim 8, further comprising:

a position sensing system of moving body loading the wireless tag, wherein a wireless tag specified by the standby for pulse string code reception activates, and a CW subcarrier response signal using a stabilized, high frequency built-in oscillation source returns to a reader side for a fixed time, whereby the reader side sweeps a query frequency within the fixed time to observe a tag-to-reader reciprocal frequency response, thereby obtaining a position of the tag is obtained.

11. The microwave band booster rectifier circuit according to claim 3, wherein a direct current bias source used as said RF signal ground level part to flow forward bias current into said rectifier diode, the ground level part of the RF input signal and the ground level part of the stub resonance booster circuit connect by a high resistance and a condenser in parallel, and a weak direct current flows in the high resistance and the rectifier diode becomes forward bias condition in order to obtain detected output even for a weak RF input signal.

\* \* \* \* \*